US009050652B2

(12) United States Patent
Ydstie et al.

(10) Patent No.: US 9,050,652 B2
(45) Date of Patent: Jun. 9, 2015

(54) METHODS FOR CASTING BY A FLOAT PROCESS AND ASSOCIATED APPARATUSES

(75) Inventors: Birger Erik Ydstie, Pittsburgh, PA (US); Sudhir Ranjan, Lexington, MA (US); Balaji Sukumar, Pittsburgh, PA (US); Sridhar Seetharaman, Pittsburgh, PA (US)

(73) Assignee: Carnegie Mellon University, Pittsburgh, PA (US)

(*) Notice: Subject to any disclaimer, the term of this patent is extended or adjusted under 35 U.S.C. 154(b) by 1028 days.

(21) Appl. No.: 13/129,313

(22) PCT Filed: Nov. 13, 2009

(86) PCT No.: PCT/US2009/006114
§ 371 (c)(1),
(2), (4) Date: Jul. 25, 2011

(87) PCT Pub. No.: WO2010/056350
PCT Pub. Date: May 20, 2010

(65) Prior Publication Data
US 2011/0280784 A1 Nov. 17, 2011

Related U.S. Application Data

(60) Provisional application No. 61/199,238, filed on Nov. 14, 2008.

(51) Int. Cl.
*C30B 15/06* (2006.01)
*C30B 15/28* (2006.01)
(Continued)

(52) U.S. Cl.
CPC .............. *B22D 11/01* (2013.01); *C30B 15/06* (2013.01); *C30B 15/30* (2013.01); *C30B 15/14* (2013.01); *C30B 15/002* (2013.01); *C30B 15/28* (2013.01);
(Continued)

(58) Field of Classification Search
None
See application file for complete search history.

(56) References Cited

U.S. PATENT DOCUMENTS 3,899,304 A * 8/1975 Linares ........................ 205/687
4,543,116 A * 9/1985 Lombard et al. ................ 65/40
(Continued)

FOREIGN PATENT DOCUMENTS

CN 101133194 A 2/2008
GB 1577343 A 10/1980
(Continued)

OTHER PUBLICATIONS

International Search Report and Written Opinion in connection with corresponding PCT/US2009/006114, filed Nov. 13, 2009, entitled "Methods for Casting by a Float Process and Associated Apparatuses," Carnegie Mellon University.
(Continued)

*Primary Examiner* — Anita Alanko
(74) *Attorney, Agent, or Firm* — Downs Rachlin Martin PLLC

(57) ABSTRACT

A method for producing a solid layer material (42), comprising providing (70) a first layer (30); providing (72) a second liquid layer (32) on the first layer (30); providing (74) a third liquid layer (34) on the second liquid layer (32), wherein the third liquid layer has a melting point that is higher than a melting point of the second liquid layer, and wherein the second liquid layer is between the first and third layers; cooling (76) a surface of the third liquid layer to a temperature less than the melting point of the third liquid layer; forming (78) the solid layer from the third liquid layer while cooling the third layer liquid; and removing (80) the solid layer.

19 Claims, 17 Drawing Sheets

(51) Int. Cl.

| | | |
|---|---|---|
| *C30B 29/06* | (2006.01) | |
| *C30B 29/60* | (2006.01) | |
| *B22D 11/01* | (2006.01) | |
| *C30B 15/30* | (2006.01) | |
| *C30B 15/14* | (2006.01) | |
| *C30B 15/00* | (2006.01) | |
| *C01B 33/037* | (2006.01) | |
| *C30B 15/22* | (2006.01) | |
| *H01L 31/18* | (2006.01) | |

(52) U.S. Cl.
CPC ............ *C01B 33/037* (2013.01); *C30B 15/007* (2013.01); *C30B 15/22* (2013.01); *C30B 29/06* (2013.01); *C30B 29/60* (2013.01); *H01L 31/182* (2013.01); *Y02E 10/546* (2013.01)

(56) References Cited

U.S. PATENT DOCUMENTS

| | | | |
|---|---|---|---|
| 4,547,259 A | | 10/1985 | Santini, Jr. |
| 5,788,945 A | * | 8/1998 | Schei .......................... 423/348 |
| RE36,156 E | | 3/1999 | Hall et al. |
| 6,368,403 B1 | * | 4/2002 | Schmid et al. ................. 117/79 |
| 7,232,544 B2 | | 6/2007 | Buseth et al. |
| 7,855,087 B2 | | 12/2010 | Kellerman et al. |
| 8,475,591 B2 | * | 7/2013 | Kellerman et al. ............ 117/26 |
| 8,603,242 B2 | * | 12/2013 | Cohen et al. ................... 117/70 |
| 2005/0139148 A1 | | 6/2005 | Fujiwara et al. |

FOREIGN PATENT DOCUMENTS

| | | |
|---|---|---|
| WO | 2006095662 A1 | 9/2006 |
| WO | 2007093082 A1 | 8/2007 |
| WO | 2010056350 A2 | 5/2010 |
| WO | 2010104838 A1 | 9/2010 |

OTHER PUBLICATIONS

Ydstie B. Erik et al., "Passivity-Based Control of the Float-Glass Process," IEEE Control Systems Magazine, 64-72, Dec. 2006.
Yuan, Z et al., "Wettability and Reactivity of Molten Silicon with Various Substrates," Applied Physics A 78, 617-622 (2004).
Voller, V. R. et al., "A fixed grid numerical modelling methodology for convection-diffusion mushy region phase-change problems," International Journal of Heat and Mass Transfer, vol. 30, No. 8, 1709-1719 (1987).
Seren, S et al., "Ribbon Growth on Substrate and Molded Wafer—Two Low Cost Silicon Ribbon Materials for PV," IEEE, 1330-1333 (2006).
Saiz, E et al., "Atomic Dynamics and Marangoni Films during Liquid-Metal Spreading." Nature Materials, vol. 3, 903-908, Dec. 2004.
Pilkington L.A.B., "Review Lecture. The Float Glass Process." Proceedings of the Royal Society of London. Series A, Mathematical and Physical Sciences, vol. 314, No. 1516, 1-25, Dec. 16, 1969.
Liu, F et al., "Intragrain Defects in Polycrystalline Silicon Thin-film Solar Cells on Glass by Aluminum Induced Crystallization and Subsequent Epitaxy," Thin Solid Films, 516, 6409-6412 (2008).
Grenko, A et al., "Single Wafer Casting," IEEE, 1415-1416 (2006).
Green, M.A. et al., "Crystalline Silicon on Glass (CSG) Thin-Film Solar Cell Modules," Solar Energy 77, 857-863, (2004).
Fujiwara, K et al., "In Situ Observation of Si Faceted Dendrite Growth From Low-Degree-of-Undercooling Melts," Acta Materialia 56, 2663-2668, (2008).
Fujiwara, K et al., "In-Situ Observations of Melt Growth Behavior of Polycrystalline Silicon," Journal of Crystal Growth 262, 124-129, (2004).
Balaji, S. et al., "Multi-scale modeling and control of fluidized beds for the production of solar grade silicon," Powder Technology, PTEC-07537; No of pp. 9 (2009).
Aberle, Armin G. "Fabrication and Characterization of Crystalline Silicon Thin-Film Materials for Solar Cells," Thin Solid Films 511-512, 26-34 (2006).
Schonecker, A. et al., "Casting Technologies for Solar Silicon Wafers: Block Casting and Ribbon-Growth-on Substrate," Solid State Phenomena, vols. 95-96, 149-158 (2004).

* cited by examiner

METHODS FOR CASTING BY A FLOAT PROCESS AND ASSOCIATED APPARATUSES

CROSS-REFERENCE TO RELATED APPLICATIONS

This application claims priority from U.S. Provisional Patent Application No. 61/199,238, filed Nov. 14, 2008, which is incorporated herein by reference.

FIELD OF THE INVENTION

The present invention is directed generally to methods for casting by a float process and for associated apparatuses and, for example, to such methods and apparatuses related to the production of silicon and solar cells.

BACKGROUND OF THE INVENTION

Many industries and products process semiconductors and semiconductor wafers into other products, such as microprocessors, computer memory, solar cells, and other devices. Semiconductor wafer have become a commodity in many cases, but the process of making wafers is still largely inefficient.

In the conventional wafering process, multi-crystalline (mc) and single-crystalline (sc) Silicon (Si) wafers are obtained by unidirectional slicing of Silicon ingots. Such processes currently account for more than 90% of annual solar cell production, and are one of the most important technologies considered for the developing photovoltaic industries today. Making solar cells from single and multicrystalline ingots of high purity Silicon is energy and capital intensive. The process is difficult to scale up due to the batch nature of many of the processing steps and the wafer process is inefficient. The wires used to cut the slabs into wafers are as thick as the wafers themselves and half of the material is therefore lost in the sawing process. This cutting material is difficult to recycle since it is mixed with iron from the wire and cutting oil. Fracture behavior, crack density, thickness variation, surface roughness and cleanness are some of the major determinants for the wafer quality with respect to sawing process. These issues make it difficult and inefficient to make very thin wafers. The material usage is therefore much higher than needed.

These deficiencies are particularly problematic in the production of solar cells where production cost is one factor which limits widespread acceptance. The rapid growth of the photovoltaic industry has put significant pressure on the industry to develop new processes for making solar grade Silicon and new technology for making solar cell wafers. During the last decade the industry growth has been 25-35% per year despite the high cost of solar generated electricity (about 4 times higher than electricity generated by a pulverized coal fired power plant.). Therefore, there is a need for new technology that will reduce cost and allow faster scale-up.

There have been several prior art approaches to reduce the cost of producing silicon wafers. One type of approach has been to abandon the batch fabrication process that dominates the industry in favor of a continuous film manufacturing process. Some of the continuous film processes on the market are Edge-defined Film-fed Growth (EFG) from Schott Solar, String Ribbon (SR) from Evergreen Solar, Molded Wafer (MW) from GE Energy (formerly known as Silicon Film™, Astro-Power), Ribbon-Growth-on-Substrate (RGS) from ECN and Crystalline-Silicon on Glass from CSG Solar.

All of these processes have one or more drawbacks. There are primarily three major processes that involve low-, intermediate- and high-temperature solid support materials. Interaction of these with Silicon influences the growth conditions of Silicon thin layer thereby affecting the crystallographic, optical and electrical properties. The Molded Wafer (MW, η=11-14%) and Ribbon Growth on Substrate (RGS, η=13-14%) processes involve solid substrates or support materials. The MW process [Hall R B, Barnett A M, Collins S R, Checchi, J C, Ford D H, Kendall C L, Lampo S M and Rand J A. Columnar-grained polycrystalline solar cell and process of manufacture. U.S. Pat. No. Re. 36,156 Mar. 23, 1999; and Grenko A, Jonczyk and Rand J. Single wafer casting. In: IEEE 4th World Conference on Photovoltaic Energy Conversion. 1415-1417 (2006).] makes wafers by melting Silicon powder in an IR furnace on continuously moving sheets of Silicon nitride coated ceramics. In the back end of the furnace the melt is cooled, similar to the Pilkington process, except that the substrate in the MW process is solid rather than liquid. However, the solid $SiN_x$ provides a large number of nucleation sites and the Silicon sheet is multi-crystalline with columnar crystal in the sub-mm to μm range. The RGS process [Seren S, Hahn G, Gutjahr A, Burgers A R, Schöecker A, Grenko A, Jonczyk R. Ribbon Growth on Substrate and molded wafer—two low cost silicon ribbon material for PV. In: IEEE $4^{th}$ World Conference on Photovoltaic Energy Conversion, 1330-1333 (2006).] uses a moving substrate (graphite or ceramic) underneath a shaping die filled with molten Silicon, where rapid crystal growth and direct contact with the cold, solid substrate material produces a sheet with crystal grains similar to the MW process. High crystal defect density (dislocation density, grain boundaries) and impurities reduce the efficiencies of the MW and RGS processes [Seren S, Hahn G, Gutjahr A, Burgers A R, Schöecker A, Grenko A, Jonczyk R. Ribbon Growth on Substrate and molded wafer—two low cost silicon ribbon material for PV. In: IEEE $4^{th}$ World Conference on Photovoltaic Energy Conversion, 1330-1333 (2006).]. High grade borosilicate/soda-lime glasses (3-5 mm thick) have also been employed commercially as a substrate for the production of Crystalline Silicon on Glass (CSG, η=7-9%) thin-film solar cells. The process utilizes polycrystalline Silicon (pc-Si, (epitaxial growth, grain size >20 μm)) as a seed layer. This cell eliminates the need for transparent conducting oxide together with the associated cost and the problems associated with stability of amorphous Silicon. Low material (Si) use, large monolithic construction, durability and ruggedness are the advantages of this type of solar cell with conversion efficiency in the range of 7-9% [Liu F, Romero M J, Jones, K M, Norman A G, Al-Jassim, M M. Intragrain defects in polycrystalline silicon thin-film solar cells on glass by aluminum induced crystallization and subsequent epitaxy. Thin Solid Films, 516, 6409-6412 (2008) and literatures thereof.]. Due to the polycrystalline nature of the seed layer, heavily defective grains always remain present in the epitaxial layer. Intra-grain defect is a major limiting factor for the electrical quality of pc-Si layer [Green M A, Basore P A, Chang N, et. al Crystalline thin-film solar cell modules. Solar Energy, 77, 857-863 (2004).].

There are some methods disclosed in prior art describing a continuous process of producing silicon wafers on molten support materials such as Tin (Sn) and Lead (Pb), similar to the float glass process. By adjusting the composition of molten support materials, spreading of Silicon and desired equilibrium thickness of silicon film can be achieved in this way. As observed in the float glass process, defects arise when the voltatilized materials from the molten surface are advected and diffused in the gas flow followed by their dropping on the top surface glass.

Glasses are known for many practical applications. Use of borosilicate and aluminosilicate glasses as substrate materials for semiconductor and photovoltaic devices are disclosed in prior art. Various methods are directed to deposit thin-film on glass substrate. These polysilicon films are limited by the non-uniformity and low electron mobility.

Accordingly, there is a need for improved silicon wafers or sheet production, particularly for low cost processes that scale up and allow for the production of textured high quality silicon multi-crystalline or single crystalline structures. Those and other advantages of the present invention will be described in more detail herein below.

BRIEF SUMMARY OF THE INVENTION

The present invention is directed generally to methods for casting by a float process and for associated apparatuses. The present invention will generally be described in terms of the production of silicon and solar cells, although the present invention is not limited to silicon and solar cells and the present invention can be used to produce other materials and products.

In general, the present invention includes a method for producing a solid layer material comprising: providing a first layer having a first density; providing a second liquid layer on the first layer; providing a third liquid layer on the second liquid layer, wherein the third liquid layer has a melting point that is higher than a melting point of the second liquid layer, and wherein the second liquid layer is between the first and third layers; cooling a surface of the third liquid layer to a temperature less than the melting point of the third liquid layer; forming the solid layer from the third liquid layer while cooling the third layer liquid; and removing the solid layer. The first layer may be either a liquid layer or a solid layer, and many other variations are possible with the present invention. The present invention also includes materials made by the processes of the present invention.

The present invention can be used to produce textured, high-quality silicon (multi-) crystal sheets with the same grain orientation and large grain sizes.

The present invention can be used to produce high purity Silicon sheets with usefulness as substrates or wafers for solar cells. In one embodiment, a method is disclosed for casting thin Silicon sheet by floating molten Silicon onto molten substrate, using a furnace. Molten Silicon and molten substrate do not adhere to each other on solidification. This method allows molten Silicon to spread on a molten pool of liquid metals, alloys and/or slags. Like oil on water, the Silicon spreads to form a thin layer which can be cooled to form a crystalline sheet (or wafer). This floating of molten Silicon over molten metals or alloys in which Si is immiscible in the presence of an intermediate glassy slag layer (e.g., in the temperature range of 1200-1500° C.), addresses the problem of purity by transferring the impurities from Silicon to slag. This two-in-one step process provides high quality of Silicon sheets (or wafers) and provides an alternative to the expensive wire saw process as well as various ribbon pulling processes. Predictions from mathematical models and experimental results are described.

The present invention can be used to produce ribbons of crystalline Silicon for solar cells. The present invention can also be used to make wafers for micro-electronics and micro-electronic machines (MEMS) since these systems also use Silicon as starting material.

Several advantages of the present invention are:
1. It uses cheap raw materials for molten slag preparation, inexpensive process equipment and allows for rapid scale-up from laboratory to pilot to industrial scale.
2. The process can be made continuous and can produce ribbons at a high rate since horizontal crystallization in the Si<111> configurational structure is obtained. Other crystalline structures can also be produced since the growth in the horizontal direction on a liquid substrate allows the crystal to form in the absence of nucleation sites.
3. Slag containment offers purification rather than contamination which results from the use of solid substrates.
4. The process can reduce the cost of wafering by a factor of at least 2-3 relative to the current wire saw process.

A primary purpose of the present invention is to utilize a molten layer of modified aluminosilicate glasses with sufficient liquidus viscocity and low liquidus temperature as a dielectric layer.

Other purposes of using a glassy layer include minimizing chemical interactions, preventing entrainment, and providing sufficient wettability and interfacial stability with respect to the working molten substrate layer during spreading followed by solidification and crystal growth.

The present invention differs from the prior art in several way, such as the present invention can control the thickness of the Silicon sheets, and the Silicon sheets can be produced continuously. The process produces very even surfaces suitable for many applications. In one embodiment, the present invention produces Silicon sheets on a molten, rather than a solid, substrate in the presence of a glassy slag supported on a high density metal or metal alloy with a melting point below that of Silicon (1414° C.) and low vapor pressure. The molten substrate according to the present invention can be, for example, Tin (Sn), Lead (Pb), or other materials.

Many variations are possible with the present invention, and those and other teachings, variations, and advantages of the present invention will become apparent from the description and figures of the invention.

BRIEF DESCRIPTION OF THE SEVERAL VIEWS OF THE DRAWING

Embodiments of the present invention will now be described, by way of example only, with reference to the accompanying drawings for the purpose of illustrating the embodiments, and not for purposes of limiting the invention, wherein.

DETAILED DESCRIPTION OF THE INVENTION

1. The Invention
1.1 The Invention Generally

The present invention will generally be described in terms of manufacturing Silicon sheets suitable for solar cells by floating molten Silicon over "molten state substrate(s)" that comprises of high-density molten metals/alloys and silicate slags. However, the present invention has other applications and may be used, for example, with materials other than Silicon and the present invention may be used, for example, to make apparatuses other than solar cells. The present invention includes many modifications and variations, and the specific descriptions and embodiments provided herein are illustrative of the present invention and not limiting.

Figure 1:
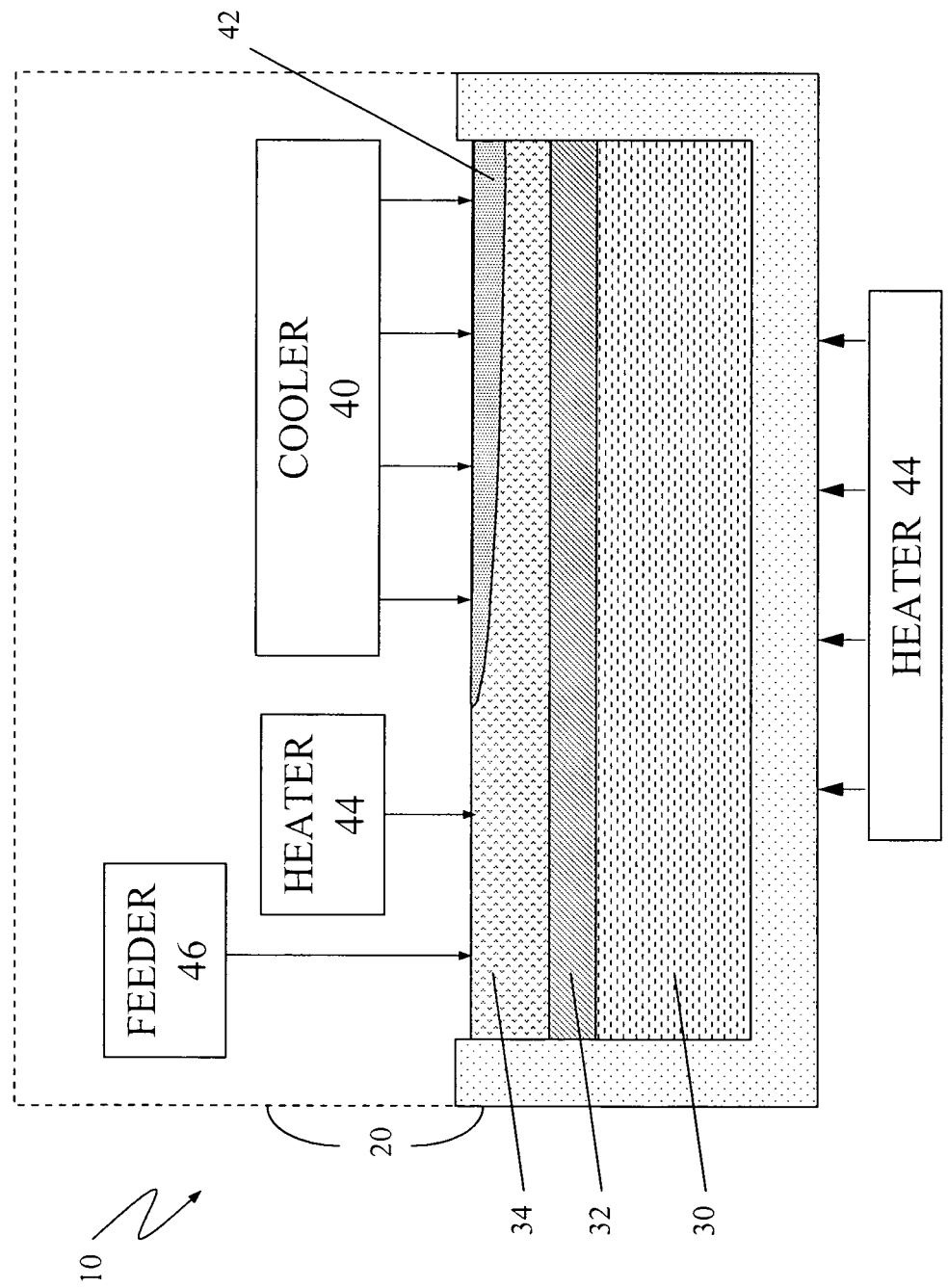
FIG. 1 illustrates one embodiment of an apparatus according to the present invention.

FIG. 1 illustrates one embodiment of an apparatus 10 according to the present invention. In that embodiment, the apparatus 10 includes a container 20 including first 30, second 32, and third 34 liquid layers. The present invention may also include a cooler 40, a heater 44, and a feeder 46.

The container 20 contains the first 30, second 32, and third 34 liquid layers. The container 20 may be open (e.g., it may have a bottom, sides, and no top), or the container 20 may also include a top and be a closed container. In some embodiments of the present invention, the container 20 is closed and provides a controlled environment for the process of the present invention. For example, the container 20 may create an inert atmosphere by being filled with an inert gas for the processing of the present invention. The container 20 may be made from materials such as alumina, quartz, or other materials which can withstand the high temperature needed to contain molten materials such as Silicon.

The first liquid layer 30 is illustrated as the bottom-most layer and has a density that is greater than that of the second 32 and third 34 liquid layers. The first layer will generally be described as being a liquid layer, although it may also be in solid form. In general, the state of the first layer 30 depends on the material used for first layer 30 and the temperature at which the second (32) and third (34) layers are maintained. For example, Tin (231.93° C.), Lead (327.46° C.), Galium (29.76° C.), Indium (156.6° C.), Thallium (304° C.), Bismuth (271.5° C.), Lanthanum (920° C.) and Uranium (1132.2° C.) have melting points below that of Silicon and, therefore, will generally be in liquid form if the third layer 34 is liquid Silicon. However, it is possible to maintain the first layer 30 at a temperature less than that of the third layer 34 such as, for example, by cooling the first layer 30 and heating the third layer 34. Alternatively, different materials may be used for the first layer 30 such as, for example, Iron (1538° C.) and Titanium (1668° C.), which have melting points higher than Silicon. Of course, if the third layer 34 is other than Silicon, then different materials may be possible for use as a solid first layer 30.

The first liquid layer 30 may be, for example, liquid metal or liquid metal alloy. In one embodiment, the first liquid layer 30 is selected from a group comprising tin, lead, alloys of tin, and alloys of lead. Binary or ternary Alloys of tin may include alloys of tin and one or more metals selected from a group comprising lead, gallium, indium, thallium, iron, titanium, bismuth and barium. Binary or ternary alloys of lead may include alloys of lead and one or more metals selected from a group comprising tin, gallium, indium, thallium, iron, titanium, bismuth and barium. Additional metals are also contemplated. For example, Uranium and Lanthanum have melting points lower than Silicon, higher density and high boiling points.

When the first layer 30 is maintained in a liquid state, the first layer 30 may, for example, lead, tin, Indium, Gallium, or alloys thereof. Alternatively, when the first layer 30 is maintained in a solid state, the first layer 30 may have a higher melting point and be, for example, Uranium, Lanthanum, Iron, Titanium, or alloys thereof.

The first liquid layer 30 may also, for example, be selected from a group comprising tin, lead, lanthanum, uranium, and their binary and ternary alloys, and wherein at least one of the alloying metals is selected from a group comprising of gallium, indium, thallium, iron, titanium, bismuth and barium.

The second liquid layer 32 is located on the first liquid layer 30 and has a density that is less than that of the first liquid layer 30 and greater than that of the third liquid layer 34. The second liquid layer 32 is between the first 30 and third 34 liquid layers.

The second liquid layer 32 will sometimes be referred to as a "bi-interface layer" because it is an interface between the first 30 and third 34 layers. The second liquid layer 32 may be a dielectric material, as described in more detail below. The second liquid layer 32 may have a concave-meniscus shape at an interface between the second liquid layer 32 and the third liquid layer 34.

The second liquid layer 32 may be, for example, liquid slag, glassy slag, aluminosilicate glass, rare earth aluminosilicate glass, and other materials. Some of the embodiments of the second liquid layer 32 will now be described in more detail.

The second liquid layer 32 may attain the form of a "glassy bi-interfacial layer" and may have the following composition, expressed in weight percent: 40-70 wt % $SiO_2$, 5-20 wt % $Al_2O_3$, 10-40 wt % $RE_xO_y$ ($La_2O_3$, $CeO_2$, $Gd_2O_3$ etc.). At least one or two modifying oxides and modifying fluorides comprising up to 2-15 wt % can be selected from the group consisting of, but not limited to, CaO, MgO, $TiO_2$, $Sc_2O_3$, $Y_2O_3$, $Nb_2O_5$, SrO, BaO, $Bi_2O_3$, LiF, NaF, $CaF_2$, $BaF_2$, $AlF_3$, $ZrF_2$, $LaF_3$, CeF3, and $GdF_3$.

The second liquid layer 32 may be a rare earth metal oxide ($RE_xO_y$). The rare earth metal oxide may be selected from a group comprising, for example, $La_2O_3$, $CeO_2$, and $Gd_2O_3$.

The second liquid layer 32 may be a rare-earth aluminosilicate glass. The rare-earth aluminosilicate glass may be, for example, the following composition when calculated in weight percent on an oxide basis: 40-70 wt % $SiO_2$, 5-20 wt % $Al_2O_3$, 10-40 wt % $RE_xO_y$.

The second liquid layer 32 may include at least one modifying oxide. The modifying oxide may be, for example, heavy metal oxides, transition metal oxides and alkaline earth metal oxides. The composition of modifying oxide, as calculated in weight percent on an oxide basis, may be 2 to 15%.

The second liquid layer 32 may include a material selected from a group comprising ternary oxides and quaternary oxyfluorides.

The second liquid layer 32 may include a modifying oxide. The modifying oxide may be selected from a group comprising $TiO_2$, $Sc_2O_3$, $Y_2O_3$, $ZrO_2$, $Nb_2O_5$, SrO, BaO, and $Bi_2O_3$. The composition of modifying oxides comprises, as calculated in weight percent on an oxide basis, 2-15% in certain embodiments. The second liquid layer may include a basic oxide. The basic oxide may be selected from a group comprising CaO, MgO, SrO and BaO.

The second liquid layer 32 may include a modifying fluoride. The modifying fluoride may be selected from a group comprising LiF, NaF, $CaF_2$, $BaF_2$, $AlF_3$, $ZrF_2$, $LaF_3$, CeF3, and $GdF_3$ within the compositional range of 2-15% for example.

The second liquid layer 32 may remove impurities from the third liquid layer 34. In particular, impurities may move or migrate from the third liquid layer 34 to the second liquid layer 32. In some embodiments, impurities in the third liquid layer 34 may be reduced to a level of less than one part per million. In one particular embodiment, boron in the third liquid layer 34 is reduced to less than 0.3 parts per million. In another particular embodiment, boron in the third liquid layer 34 is reduced to between 0.3 parts per million and 0.1 parts per million.

The third liquid layer 34 is located on the second liquid layer 32 and has a density that is less than the density of the first liquid layer 30 and less than the density of the second liquid layer 32. The third liquid layer 34 also has a melting point that is higher than that of the second liquid layer 32.

The third liquid layer 34 will generally be described as being liquid Silicon, although the present invention is not limited to such embodiments and the third liquid layer 34 may be materials other than liquid Silicon 34.

A cooler 40 cools the surface of the third liquid layer 34. For example, the cooler 40 may be used to cool the surface of the third liquid layer 34 so that the temperature of the surface of the third liquid layer 34 becomes less than its melting point, thereby resulting in at least some of the material in the third liquid layer 34 transitioning from a liquid state to a solid state 42. In other words, the cooler 40 cools the third liquid layer 34 and forms a solid layer 42 from the material of the third liquid layer 34.

The cooler 40 may be, for example, a relatively cool plate which allows for cooling the third layer by absorbing the energy emitted from the third layer by radiation. The cooler 40 may also actively reduce the temperature by providing cool ambient conditions. Alternatively, the cooler 40 may comprise one or more fans moving a cooled gas across the relatively hot surface of the third liquid layer. Inert gases like helium and argon may be introduced to remove heat by conduction and convection. It is also possible to introduce reducing atmospheres which contain hydrogen or other gases to remove oxides from liquid and solid surfaces.

The heater 44 may be used to heat the materials in the container 20. The heater 44 may, for example, be used to maintain the various materials in the container 20 within a desired temperature range, to melt solid materials which are added to the container 20, or to otherwise operated the present invention as described herein. The present invention may use one or more heaters 44. For example, one heater 44 may be used to keep the bottom of the process hot so that layers one and two remain liquid while layer three is cooled. Another heater 44 may be used to melt material that is added to the container 20, such as solid silicon, and one or more additional heaters 44 may be used to heat the first 30, second 32, and third 34 liquid layers.

The feeder 46 introduces silicon or other materials into the container 20. The feeder 46 may be used to replenish material that is intentionally removed from the container 20, such as the material which is used to form the solid layer 42. The feeder 46 may also be used to replenish material which inadvertently leaves the container 20, such as the material from the third liquid layer 34 which may inadvertently be removed from the container 20 when the solid layer 42 is removed from the container 20. Such loss of material from the third liquid layer 34 may occur in both batch processing and continuous processing embodiments of the present invention. The feeder 46 may, for example, provide preheated, liquid silicon into the container 20 to be used in the apparatus 20 to form the solid layer 42. In another embodiment, the feeder 46 may introduce solid silicon into the container 20 and that solid silicon may be subsequently heated and melted in the container 20 to form part of the liquid silicon in the third liquid layer 42. Although the present invention is generally described in terms of producing solid silicon, other materials may be used with the present invention and, therefore, the feeder 46 may be used to introduce materials other than silicon.

The feeder 46 may be used to replenish material at the rate at which it is being withdrawn. In the batch system of the present invention, the liquid or solid material may be added by the feeder 46 in a batch manner to compensate for the batch removal of the solid material 42. In the continuous system of the present invention, the feed material may be added at the same rate as the material is removed so that the process achieves a time-invariant steady state operating point which may be optimized by a computer control system to achieve desirable product characteristics.

The cooling and heating rates and other process parameters such as the feed-rate of the Silicon can be adjusted so that the solidified layer forms a single crystal with desired width and thickness. Alternatively, the present invention may be used to make multi-crystalline structures The parameters may also be adjusted so that several crystalline domains are formed. In one embodiment of the present invention, these adjustments are made using a computer control system which optimizes the process parameters.

The solid layer 42 may, for example float on the third liquid layer 34, as is the case if Silicon is the third liquid layer 34 and solid layer 42. However, in other embodiments the solid layer 42 may not float on the third liquid layer 34.

The solid layer 42 in the illustrated embodiment is separated from the second liquid layer 32 by at least a portion of the third liquid layer 34 at all points in the apparatus 10. This offers an advantage of the third liquid layer 34 being a lubricant to allow the solid layer 42 to move more easily relative to the first 30 and second 32 liquid layers. This arrangement is possible when the material has less density in its solid state than in the liquid state. Examples of such materials include water and Silicon. Such movement is helpful in a continuous manufacturing process in which the solid layer 42 moves within the container 20 past the cooler 40 and, in some case, other devices as the solid layer 42 is being formed. Furthermore, even in a bulk manufacturing process it may be helpful to move the solid layer 42 within the container 20. Therefore, maintaining at least a portion of the third liquid layer 34 between the solid layer 42 and the second liquid layer 32 may be desired. However, in other embodiments the solid layer 42 may grow sufficiently thick that it touches the second liquid layer 32 and there is not significant third liquid layer 34 between the solid layer 42 and the second liquid layer 32.

The solid layer 42 may move relative to the first 30 and/or second 32 liquid layers. In this way, the solid layer 42 may be moved near or past the cooler 40 and, as a result, the third liquid layer 34 and the solid layer 42 will continue to be cooled and the solid layer 42 will continue to grow (e.g., become a thicker layer).

The apparatus 10 of the present invention may be used to make a solid sheet 42 from the materials of the third liquid layer 34. For example, the third liquid layer 34 may be silicon and the present invention may be used to make sheets of solid silicon with relatively few defects and with a single crystal structure (the present invention may also be used to make a multi-crystal structure). In one embodiment the solid layer 42 is silicon having a <111> crystalline orientation. In another embodiment the solid layer 42 is silicon having a <111> crystalline orientation parallel to an interface between the second 32 and third 34 liquid layers.

The present invention may also be used to make other materials, although the present invention will generally be described in terms of making silicon and in terms of making solar cells.

Although the present invention will generally be described in terms of the first layer 30 being in liquid form, the present invention may also be practiced with the first layer 30 in solid form. In other words, the first layer 30 is a solid, and the second 32 and third 34 layers are liquid. This may be accomplished, for example, by selecting a first layer 30 material that remains solid in the temperature range experienced in the present invention, or the apparatus 10 may cool the first layer 30 to allow it to remain in solid form.

Many variations and modifications are possible with the present invention. In one embodiment, for example, the third liquid layer (34) has a melting point of approximately 1414° C. and a density of approximately 2.57 g/cm$^3$, the second liquid layer (32) has a melting point of approximately 1200-1350° C. and a density of approximately 3-4 g/cm$^3$, and the first liquid layer (30) has a melting point of approximately 250-400° C. and a density of approximately 6-7 g/cm$^3$. Different materials may be used to provide for different melting points and different densities to accommodate different applications of the present invention.

Figure 2:
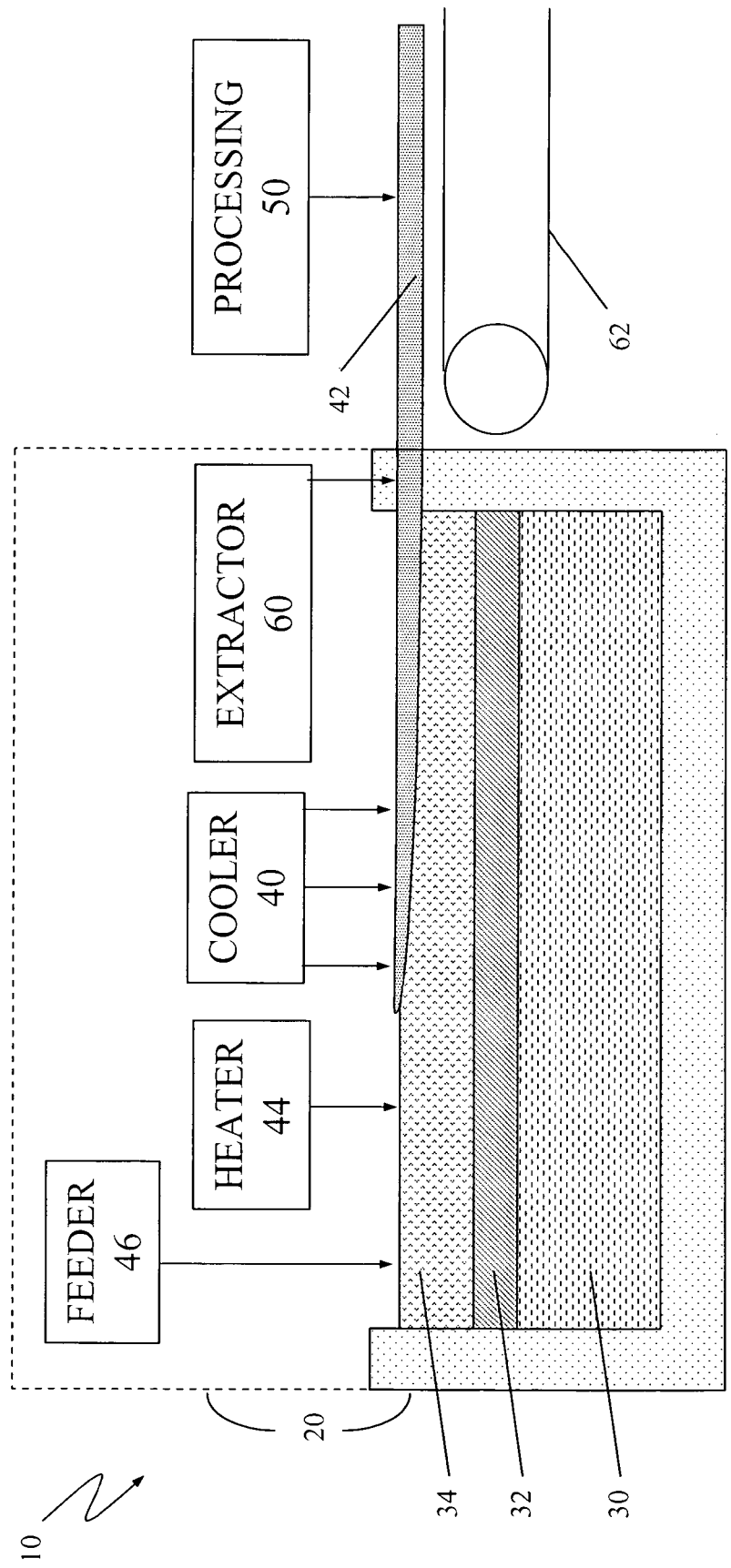
FIG. 2 illustrates another embodiment of an apparatus according to the present invention.

FIG. 2 illustrates another embodiment of the apparatus 10 according to the present invention. In that embodiment the apparatus 10 includes a processing device 50 and an extractor 60. The processing device 50 operates on the solid layer 42 after the solid layer 42 is removed from the third liquid layer 34. In the illustrated embodiment, a conveyer belt 62 is used to move the solid layer 42 when it is outside the container 20.

The processing device 50 may be one or more devices that provides for further processing of the solid layer 42. Many variations are possible with the processor 50, some of which will be described.

The extractor 60 removes the solid layer 42 from the third liquid layer 34. The extractor 60 may, for example, include suction or mechanical devices to engage the solid layer 42 and lift it from the container 20. Alternatively, the extractor 60 may utilize other ways of lifting the solid layer 42 from the container 20, such as by supporting the bottom of the solid layer 42 and lifting it from the container 20, engaging the edges of the solid layer 42, or engaging the top surface of the solid layer 42, such as with suction, adhesive, friction, or otherwise. The extractor 60 may, for example, cut the solid layer 42 and lift the cut portion from the third liquid layer 34. Such cutting can be achieved using a laser. This embodiment of extractor 60 may be used, for example, with either batch processing or continuous processing. In another embodiment the solid layer 42 may be removed in its entirety without cutting it. After the solid layer is removed by the extractor 60, a new solid layer 42 may be formed and the process repeated. This form of extractor 60 may be used, for example, in a batch processing.

In another embodiment, the extractor 60 may guide the solid layer 42 out of the container 20 in a continuous piece or in batches, such as by guiding the solid layer 42 through an opening in the side of the container 20, by guiding the solid layer 42 out of the third liquid layer 34, such as via a ramp or conveyor belt, or by other means. This embodiment of the extractor 60 may be used, for example, in continuous processing. In other embodiments, the extractor 60 may be eliminated and the solid layer 42 may pass out of the container 20 without an extractor 60, such as thorough an opening in the container 20 or over a wall of the container 20 without further assistance.

FIGS. 3-6 illustrate several embodiments of removing the solid layer 42 from the container 20 according to the present invention.

Figure 3:
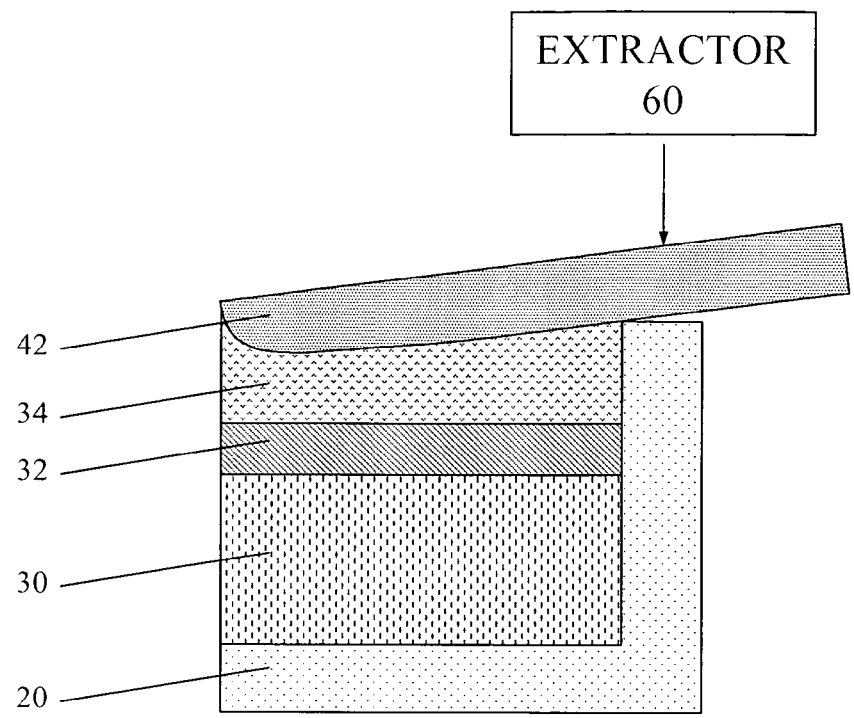
FIGS. 3-6 illustrate embodiments for removing solid material according to the present invention.

FIG. 3 illustrates an embodiment in which the solid layer 42 is lifted over the wall of the container 20 and pulled or pushed from the container 20. The extractor 60 may be used for example, to lift the edge of the solid layer 42 over the wall of the container 20 in order to initiate the removal of the solid layer 42. In this and other embodiments of the present invention, the extractor 60 may also be used to guide and/or support the solid layer 42 as it is being removed from the container 20. This may be accomplished, for example, by the extractor 60 supporting the solid layer 42 to prevent excessive being and to prevent breaking the solid layer 42 as it is being moved over the wall and out of the container 20. The extractor 60 may be used to support the solid layer 42, for example, by providing the extractor 60 with guides or supports that are placed under the solid layer 42 to facilitate the removal of the solid layer 42 from the container 20.

Figure 4:
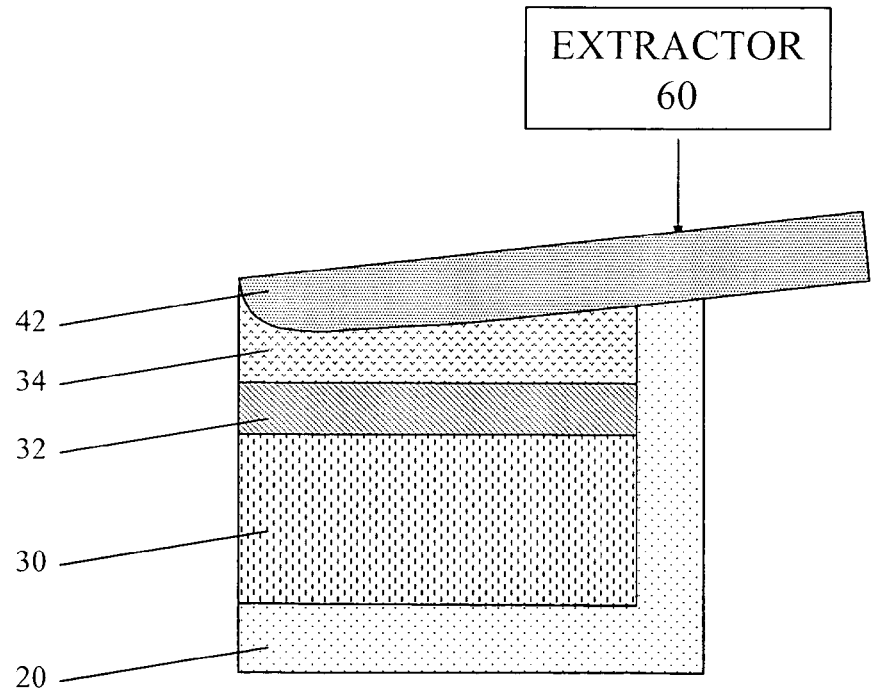

FIG. 4 illustrates an embodiment of the present invention in which the top surface of the wall of the container 20 is angled to facilitate the solid layer 42 sliding over the wall of the container 20 and out of the container 20.

Figure 5:
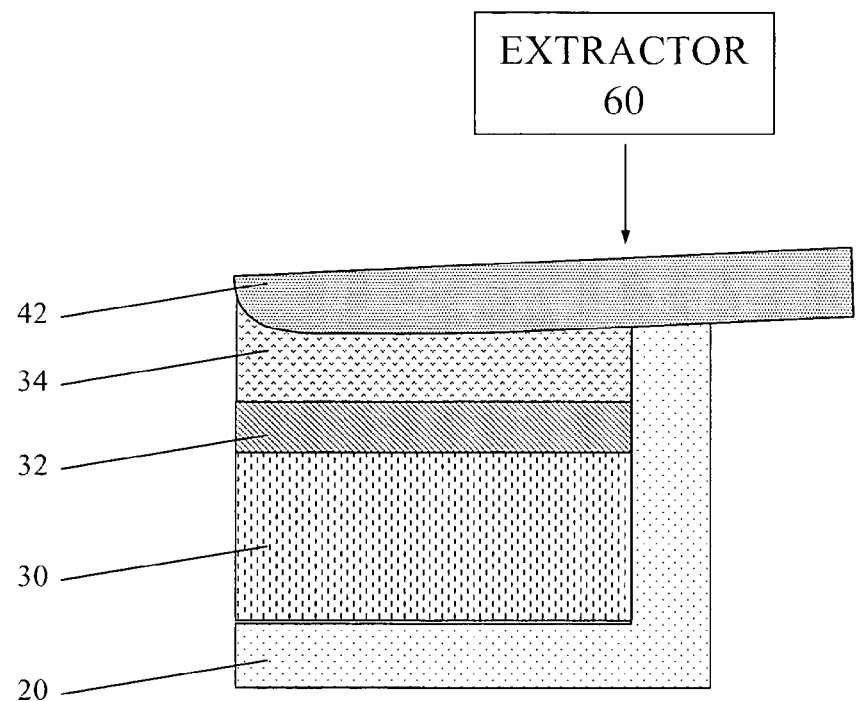

FIG. 5 illustrates an embodiment of the extractor 60 in which the wall of the container 20 is approximately level with the top surface of the third liquid layer 34 so that the solid layer 42 floats above the wall of the container 20 and can be more easily moved over the wall of the container 20 and out of the container 20.

Figure 6:
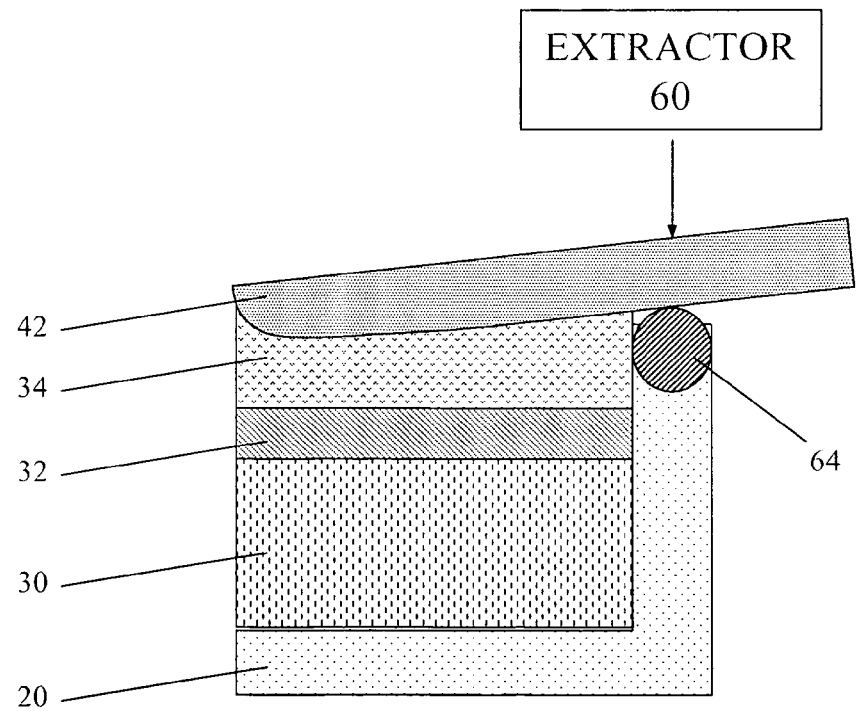

FIG. 6 illustrates an embodiment of the extractor 60 in which a roller 64 is provided in the wall of the container 20 to allow the solid layer 42 to be more easily moved over the wall of the container 20 and out of the container 20. The roller may be located near the top surface of the third liquid layer 34, or it may be located above the top surface of the third liquid layer 34. The roller 64 may also be used, for example, with an angled top surface of the wall of the container 20. This combination may be particularly useful if the roller 64 is located significantly above the top surface of the third liquid layer 34, thereby requiring the solid layer 42 to be removed at an angle.

In general, material from the third liquid layer 34 will be lost as the solid layer 42 is removed from the container 20. Some embodiments, however, will result in more loss than others. In embodiments in which the wall of the container 20 is at or near the top surface of the third liquid layer 34, it is expected that there will be relatively more loss of material from the third liquid layer 34 because material will spill over the wall of the container 20 when the solid layer 42 is being removed from the container 20. This additional loss of material from the third liquid layer 34 can be replaced with additional material added through the feeder 46. This loss of material is not necessarily detrimental, however, because the impurities in the third liquid layer 34 tend to remain in the third liquid layer 34 and not become part of the solid layer 42. As a result, the concentration of impurities in the third liquid layer 34 will tend to increase, but the present invention can compensate for this increase in impurities in the third liquid layer 34. For example, depending on the materials used, the second liquid layer 32 has a tendency to accept impurities. This is often true for the glassy/slag materials described herein for use as the second liquid layer 32. Also, the present invention allows for removing material from the third liquid layer 34 and replacing it with new material having fewer impurities. This is generally desirable and can be accomplished, at least in part, through the loss of material from the third liquid layer 34 as described herein, and through the addition of new material from the feeder 46.

Figure 7:
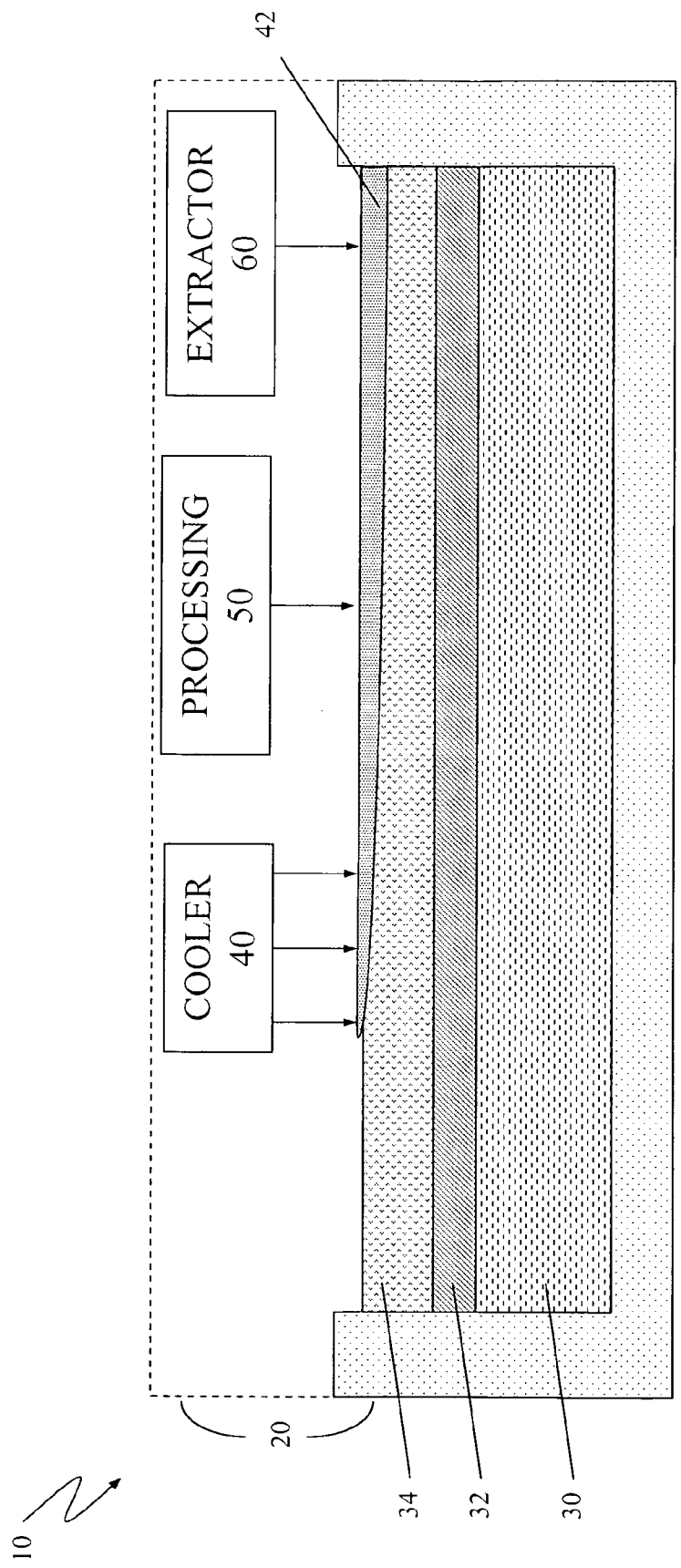
FIG. 7 illustrates another embodiment of an apparatus according to the present invention.

FIG. 7 illustrates another embodiment of the invention in which a processing device 50 is located within the container 20. In that embodiment, processing of the solid layer 42 is performed while the solid layer is still within the container 20 and on the third liquid layer 34.

Many variations are possible with the present invention. For example, the present invention will generally be described in the context of the first liquid layer 30 have a density greater than that of the second 32 and third 34 liquid layers, and also in the context of the second liquid layer 32 having a density that this greater than the density of the third liquid layer 34. However, it is possible for different relative densities to be used with the present invention. For example, the third liquid layer may have a density that is greater than that of the second liquid layer 32 if, for example, the second liquid layer 32 has sufficient surface tension to support the third liquid layer 34. Similarly, the first liquid layer 30 may have a density that is less than that of the third liquid layer 34 if, for example, the second liquid layer 32 can maintain a barrier between the first 30 and third 34 layers so that they maintain their relative position in the system. Other variations and modifications are also possible.

Figure 8:
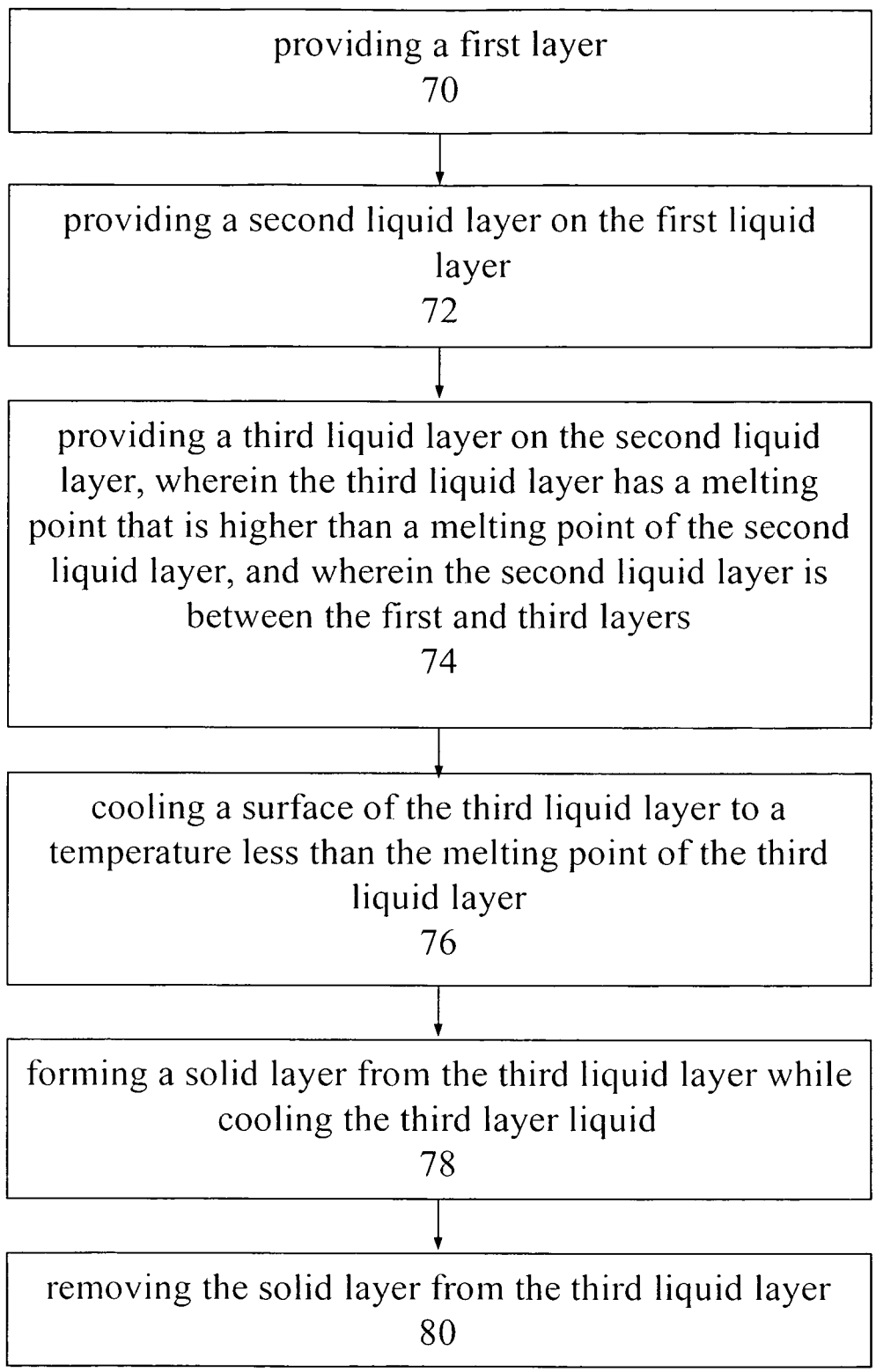
FIG. 8 illustrates one embodiment of a method according to the present invention.

FIG. 8 illustrates one embodiment of a method for producing a solid layer 42 according to the present invention. The method may be implemented, for example, with the apparatuses described herein or with other apparatuses.

Step 70 includes providing a first layer. As mentioned above, the first layer may be a material in either liquid or solid form.

Step 72 includes providing a second layer on the first liquid layer. If the first layer is liquid, then the second liquid layer will generally have a density that is less than the density of the first liquid layer. If the first layer is in solid form, then the relative densities may not be important. Step 74 includes providing a third liquid layer on the second liquid layer, wherein the third liquid layer has a melting point that is higher than a melting point of the second liquid layer, and wherein the second liquid layer is between the first and third layers. In some embodiment, the third liquid layer has a third density that is less than the second density. However, in other embodiments, this may not be required.

Step 76 includes cooling a surface of the third liquid layer to a temperature less than the melting point of the third liquid layer.

Step 78 includes forming a solid layer from the third liquid layer while cooling the third layer liquid.

Step 80 includes removing the solid layer from the third liquid layer.

Many variations are possible with the present invention, some of which are described below.

Step 74, providing the third liquid layer, may include: providing a material in a solid form on the second liquid layer 32, and melting the solid material on the second liquid layer 32 to form the third liquid layer 34. In other words, a liquid layer 34 of silicon may be provided by providing solid silicon on the second liquid layer 32, and melting that solid silicon to form a third liquid layer 34 of silicon. Alternatively, providing the third liquid layer may include flowing the third liquid layer 34 onto the second liquid layer 32. In other words, liquid silicon, as opposed to solid silicon, may be applied to the second liquid layer 32.

Step 78, forming a solid layer 42, may include forming the solid layer 42 wherein the first liquid layer 30 does not adhere to the solid layer.

Step 78, forming a solid layer 42, may include forming the solid layer 42 wherein the first liquid layer 30 does not react chemically with the solid layer 42.

Step 78, forming a solid layer 42, may include forming the solid layer 42 wherein the first liquid layer 30 does not entrain into the solid layer 42.

Figure 9:
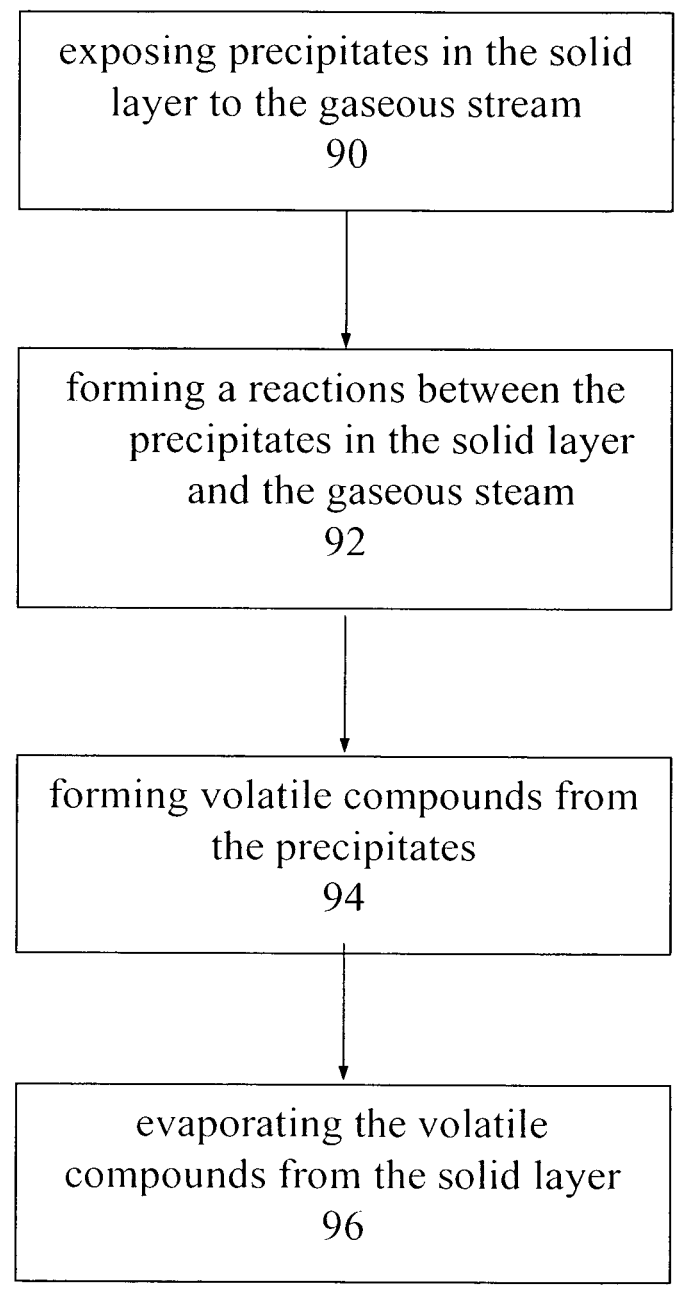
FIG. 9 illustrates another embodiment of a method according to the present invention.

FIG. 9 illustrates one embodiment of the present invention that may be implemented, for example, with the processor 50 to remove particulates from the solid layer 42. In particular, the solid layer 42 is exposed to a gaseous stream including Hydrogen and Argon.

Step 90 includes exposing precipitates in the solid layer 42 to the gaseous stream. The gaseous stream may be, for example, Hydrogen and Argon.

Step 92 includes forming a reaction between the precipitates in the solid layer and the gaseous steam.

Step 94 includes forming volatile compounds from the precipitates. These volatile compounds may be formed as a layer on the solid layer 42 by deposition of chemicals from the gaseous stream.

Step 96 includes evaporating the volatile compounds from the solid layer.

The present invention will now be described in terms of several more specific embodiments. These embodiments are illustrative of the invention and are not limiting.

Figure 10:
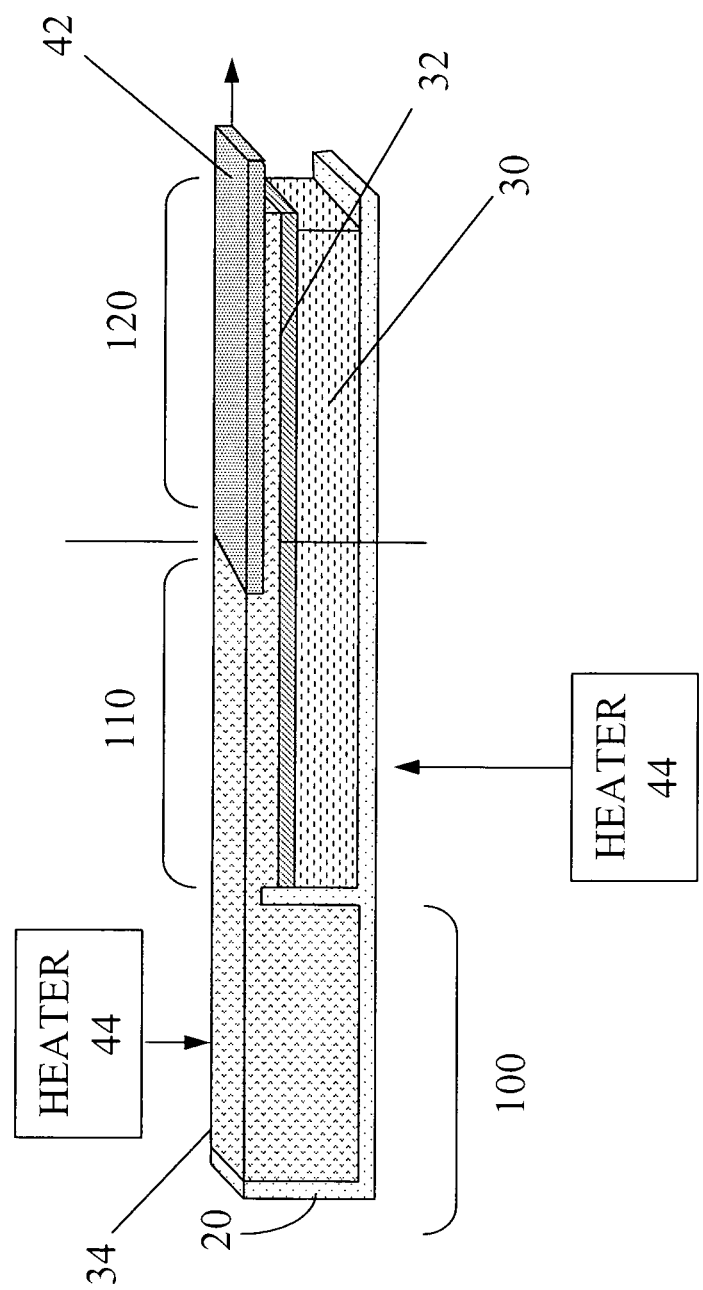
FIG. 10 illustrates one embodiment of a system for continuous manufacturing of thin Silicon sheet.

FIG. 10 illustrates a cutaway view of one embodiment of the present invention in the form of an apparatus for the continuous production of Silicon wafers or other materials using molten liquid(s), as opposed to a solid material, as a flat working surface. The present invention may use, for example, a two-component, two-layer process or a three-component, three-layer process. The present invention may utilize, for example, tin metals or tin-lead alloys and/or rare-earth aluminosilicate slags. The embodiments and descriptions of the present invention are based on actual experiments as well as on integrative experimental and computational approaches [Ydstie B E, Ranjan S, Balaji S, Sridhar S. Casting of solar quality Silicon sheet (or wafer) by float process. US patent— "Patent Pending" (2008); and Balaji S, Ranjan S, Ydstie B E. Numerical Modeling of Horizontal Wafering of Silicon Melts on a Molten Substrate. AIChE Annual Meeting, Nov. 16-21, Philadelphia, USA (2008).]. In this embodiment, the process is performed in an inert atmosphere.

In that embodiment, there is a first tank 100 which is the molten silicon zone with a temperature of approximately 1475° C. One or more heaters 44 may be used to maintain the desired temperature in the first tank 100.

There is also a second tank (collectively 110 and 120) which includes a float area 110 and a cooling area 120. The float area 110 is maintained at approximately 1375-1200° C., which is a desirable temperature to melt the second liquid layer 32 in the presence of the first liquid layer 30. One or more heaters 44 may be provided to maintain the desired temperature in the second tank 110 and 120. In the second tank the silicon is crystallized and begins to form the solid layer 42. In the second tank the first 30, second, 32, and third 34 liquid layers have densities of approximately 7 g/cm$^3$, 3-4 g/cm$^3$, and 2.57 g/cm$^3$, respectively.

In the cooling zone 120 the temperature is reduced to continue forming the solid layer 42. The temperature of the cooling zone 120 may be approximately 900-600° C.

This embodiment of the present invention may be used, for example, for continuous silicon wafer production, or for the production of other materials.

Although this embodiment of the present invention has been described in terms of first 100 and second 110 and 120 tanks, the present invention does not require separate tanks and the first 100 and second tanks 110 and 120 can refer to different parts of the same physical tank or container 20 which are maintained at different temperatures. Furthermore, many variations are possible with this embodiment of the present invention. For example, although a cooler 40 is not illustrated in this embodiment, a cooler 40 may be provided, although it is not necessarily required by the present invention.

1.2 Current Thin Film Technology

The present invention provides a method to cast a thin sheet of a material on a liquid to make wafers for solar cells. There exist other methods to make thin sheets suitable for solar cells. The process described in references [Hall R B, Barnett A M, Collins S R, Checchi, J C, Ford D H, Kendall C L, Lampo S M and Rand J A. Columnar-grained polycrystalline solar cell and process of manufacture. U.S. Pat. No. Re. 36,156 Mar. 23, 1999; and Grenko A, Jonczyk and Rand J. Single wafer casting. In: IEEE 4$^{th}$ World Conference on Photovoltaic Energy Conversion. 1415-1417 (2006).] makes Silicon sheets by melting Silicon powder in an IR furnace on continuously moving sheets of Silicon nitride coated ceramics. In the back end of the furnace the melt is cooled and a sheet of multi-crystalline Silicon is formed. The main disadvantage of this process is that the solid SiN, provides a large number of nucleation sites and the Silicon sheet becomes multi-crystalline with columnar crystal in the sub-mm to μm range.

The ribbon growth on substrate (RGS) process [Seren S, Hahn G, Gutjahr A, Burgers A R, Schöecker A, Grenko A, Jonczyk R. Ribbon Growth on Substrate and molded wafer—two low cost silicon ribbon material for PV. In: IEEE 4$^{th}$ World Conference on Photovoltaic Energy Conversion, 1330-1333 (2006).] uses a moving substrate (graphite or ceramic) underneath a shaping die filled with molten Silicon. Rapid crystal growth and direct contact with the cold, solid substrate material produces a sheet with crystal grains similar to the MW process. High crystal defect density (dislocation density, grain boundaries) and impurities reduce the efficiencies of the MW and RGS processes [Seren S, Hahn G, Gutjahr A, Burgers A R, Schöecker A, Grenko A, Jonczyk R. Ribbon Growth on Substrate and molded wafer—two low cost silicon ribbon material for PV. In: IEEE 4$^{th}$' World Conference on Photovoltaic Energy Conversion, 1330-1333 (2006).].

High grade borosilicate/soda-lime glasses (3-5 mm thick) have been found useful and have been employed commercially for the production of Crystalline Silicon on Glass (CSG) thin-film solar cells that utilizes polycrystalline Silicon [Liu F, Romero M J, Jones, K M, Norman A G, Al-Jassim, M M. Intragrain defects in polycrystalline silicon thin-film solar cells on glass by aluminum induced crystallization and subsequent epitaxy. Thin Solid Films, 516, 6409-6412 (2008) and literatures thereof.]. Due to polycrystalline nature of seed layer, heavily defective grains remain always present in the epitaxial layer. Intra-grain defect is a major limiting factor for the electrical quality of pc-Si layer [Green M A, Basore P A, Chang N, et. al Crystalline thin-film solar cell modules. Solar Energy, 77, 857-863 (2004).].

Many other methods have been proposed.

One advantage of using a liquid substrate according to the present invention is the continuous production of textured high quality Silicon (multi-) crystals or single-crystalline silicon wafer as compared to the multicrystalline wafers derived from solid substrate casting processes [Schönecker A, Geerlings L and Muller A. Casting technology for solar silicon wafer: block casting and ribbon-growth-on substrate. Solid State Phenomena, 95-96, 149-158 (2004).] or crystalline Silicon thin-film on a glass substrate [Aberle A G. Fabrication and characterization of crystalline Silicon thin film materials for solar cells. Thin Solid Films, 511-522, 26-34 (2006).]. The solar-to-electricity conversion efficiency is low for these systems due to the large number of defects at crystal boundaries.

1.3 Description of Process

Figure 11:
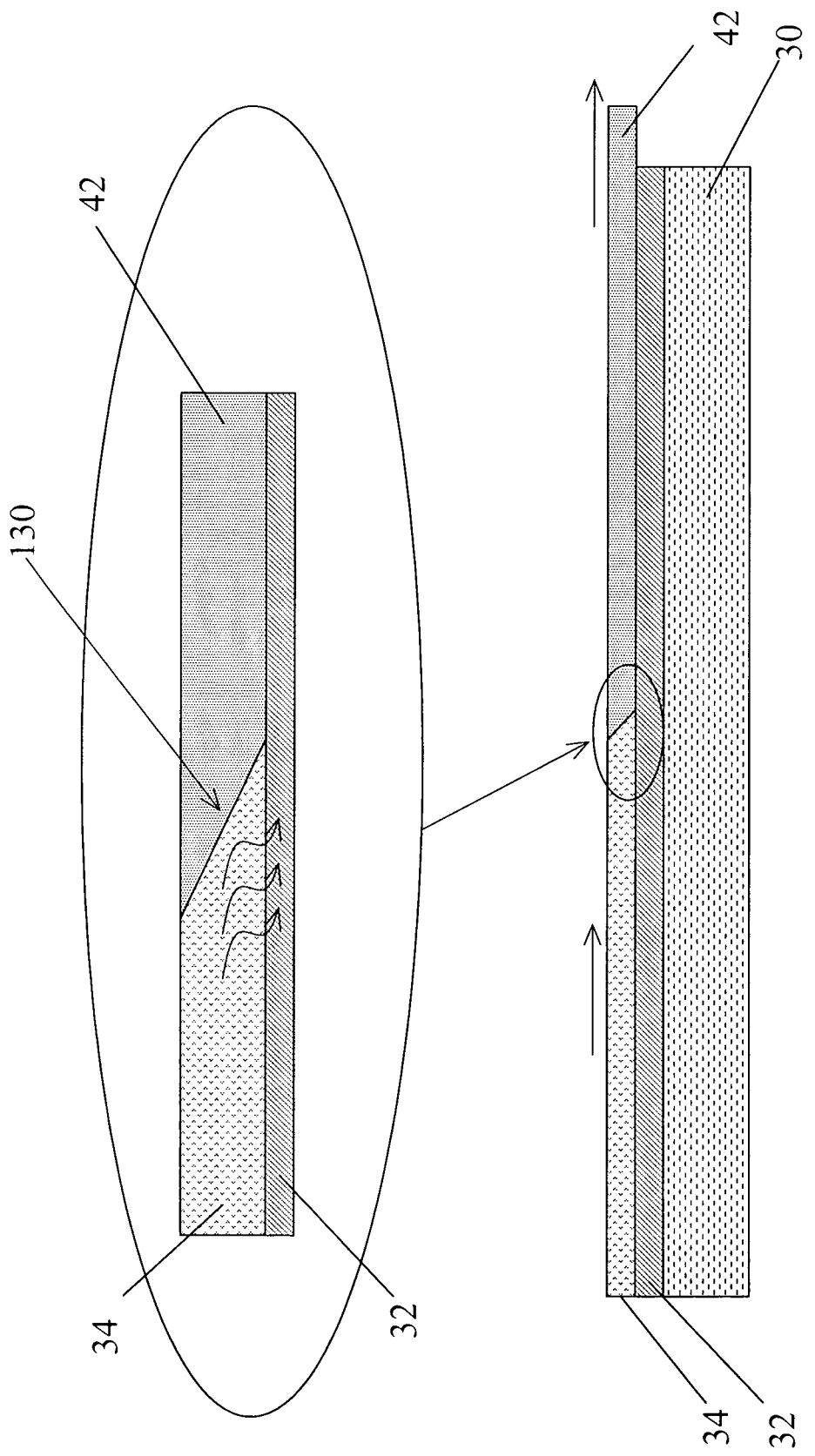
FIG. 11 illustrates one embodiment of the present invention.

It could be said that some embodiments the present invention combine aspects of the Pilkington process for making flat glass [Pilkington LAB. The Review lecture, the float glass process. Proceedings of the Royal Society of London. Series A, mathematical and Physical Sciences 314, 1-25 (1969).] and nonreactive spreading of molten metals and oxides on solid substrates [Saiz E and Tomsia A P. Atomic dynamics and Marangoni films during liquid-metal spreading. Nature Materials, 3, 903-908 (2004).]. The Pilkington process produces flat glass by pouring the glass melt onto molten tin and the melt is allowed to cool and withdrawn as a continuous sheet. As shown in FIGS. 10 and 11, the first liquid layer 30, e.g. tin metal or tin-lead alloy provides a uniform, smooth working surface as in the Pilkington glass process.

The use of a di-electric second liquid layer 32, e.g. silicate glasses supported by layer 30, which has lower melting point than silicon provides one important distinction from the Pilkington process.

The second liquid layer 32 serves several important purposes. First, it prevents inter-metallic inclusion and contamination from volatiles at high temperature. Second, it maintains a liquidus state during solidification and crystallization. Third, it prompts silicon to solidify by continuous cooling to form a thin (<300 μm) single-crystalline Si<111> sheet. Fourth, slag removes metallic impurities without entraining to and from the molten Silicon film at a level below 1 ppm. Close observation (FIG. 12) and XRD analysis (FIG. 13) of continual forming of silicon sheet suggest that first solidifying layer can produce textured high-quality silicon crystal sheet with same grain orientation and large grain sizes. Moreover, In-line texturization and enhanced solar absorptivity will be additional novel features of this direct manufacturing of Silicon wafers.

Our invention sees a marked change and differs from the prevailing technology in the sense that single-crystalline Silicon sheets of controlled thickness can be produced continuously on a molten, rather than a solid substrate in presence of a glassy slag supported on a high density metal or alloy with melting point below that of Silicon (1414° C.) and low vapor pressure [Ydstie B E, Ranjan S, Balaji S, Sridhar S. Casting of solar quality Silicon sheet (or wafer) by float process. US patent—"Patent Pending" (2008).]. With respect to the reported literatures [Santini Jr., WA. Manufacture of sheets of controlled thickness from meltable material. U.S. Pat. No. 4,547,259, Oct. 15, 1985; and Jin Y. A Process of producing silicon wafer employing float method and apparatus thereof. World Patent No., WO2007/093082 A1, Aug. 23, 2007] that use molten metals/alloys as floating agent and crystalline buffer/tip to initiate crystallization, our invention describes use of high density glassy layer as an effective means of creating realistic environment for no entrainment of highly reactive molten Silicon as well as a little or no contamination of Silicon upon feeding into molten metal-slag system. Such a system induces effectively a condition for solidification [Balaji S, Ranjan S, Ydstie B E. Numerical Modeling of Horizontal Wafering of Silicon Melts on a Molten Substrate. AIChE Annual Meeting, Nov. 16-21, Philadelphia, USA (2008).] and crystallization, solves the problem of having many nucleation sites by using a molten rather solid substrate and thereby improving further the quality of Silicon sheet (or wafer). We anticipate that these wafers will be of immediate use to solar panels due to the presence of in-line texturing process. As we observe that a modern, high through-put Pilkington process can produce 600 tons of high quality glass per day [Ydstie B E and Jiao Y. Passivity based control of the float glass process. IEEE Control system Magazine pp. December 64-72 (2006).]. It is envisioned that proposed float system will be easier to operate, and will be more affordable, a point of paramount importance in real world of solar application, as compared to other ribbon-based wafer technologies. In addition, these solar quality wafers will be inexpensive to produce.

The processes disclosed in prior art such as the EFG and SR processes are slow, difficult to scale up, and difficult to control. This results in these processes having lower yields and failing to achieve the cost reductions needed in the industry. Also, the ribbon growth technology (MW and RGS) uses solid substrate to support the Silicon during crystallization and the solid substrate provides a large number of nucleation sites and the resulting sheet is multi-crystalline with crystal sizes in the sub-mm to µm range. Silicon thin film technology on Glass substrate is polycrystalline in nature. As a consequence, the crystal quality suffers, thereby limiting the minority carrier lifetime of the materials and failing to produce the high quality product produced by conventional ingot and sawing processes. We conclude from these results that for such silicon films (or wafers) to be useful for solar cells; 1) continuous production of single-crystalline sheet or film, 2) use of cheap raw materials, and 3) economical manufacturing unit (FIGS. 10 and 11) can become an alternative.

2.1.2. High Temperature Spreading of Molten Silicon on Solid Substrate

Wettability, reactivity and in-situ observation of interfacial morphology of molten Silicon on various solid substrates have been investigated in terms of measuring contact angles and observing Mullins-Sekerka instability of growth interface in a Silicon melt [Fujiwara, K. Obinata, Y., Ujihara, T., Usami, N., Sazaki, G., Nakajima, K. In-Situ observations of melt growth behavior of polycrystalline silicon. Journal of Crystal Growth, 262, 124-129 (2004); and Fujiwara K, Maed, K, Usami N, Sazaki G, Nose Y, Nomura A, Shishido T, Nakajima K. In situ observation of Si faceted dendrite growth from low-degree of undercooling melts. Acta Materialia, 56, 2663-2668 (2008); and Yuan Z, Huang W L, Mukai K. Wettability and reactivity of molten silicon with various substrates. Applied Physics A, 78, 617-622 (2004)]. It is the dynamics of wetting of molten Silicon on a solid substrate that most affects the crystal growth behavior and the microstructure of Silicon irrespective of the spreading, reactive or non-reactive. Numerical simulations are one of the effective tools that have been used to study the melt flow, the interface shape and Silicon crystallization in ingot and ribbon pulling process.

2.1.3 Role of Slag

It has been shown that silicate slags containing appropriate amount of alkali and alkaline oxides can remove impurities such as boron, (<1 ppm) with no inclusion of slag in the Silicon [Fujiwara H, Otsuka R, Wada K and Fukuyama T. Silicon purifying method, slag for purifying silicon and purified silicon. U.S. Pat. No., 2005/0139148 µl Jun. 30 (2005); and Ito N. Method for producing high purity silicon. World Patent No., WO 2006/095662 A1, Sep. 14 (2006); and Buseth T, Friestad K and Runde P. Apparatus for continuous slag treatment of Silicon. U.S. Pat. No., 7,232,544 B2, Jun. 19, (2007).].

2.2 Summary of Supporting Data and Process Simulation

Manufacturing systems that are proposed use four physical principles in construction:

1. High-temperature spreading and stabilized fluid flow
2. Heat transfer and creation of self-aligned heat reservoir
3. Liquid-liquid interface and condition for crystallization
4. Interphasic separation The dependence of thermo-physical properties, (viscosity, thermal conductivity), and thermodynamic properties (heat-capacity, interfacial tension) on temperatures determines practically all stages of the process. Keeping this in mind, we used the thermodynamics data-base package FactSage (Degterov and Pelton, 1999) to determine four different candidate glass slags {units in (wt %)}.

[a]: $SiO_2$ (70), $Na_2O$ (15), CaO (5), $Al_2O_3$ (5) and MgO (5)
[b]: $SiO_2$ (40), CaO (10), $Al_2O_3$ (40), $Na_2O$ (10)
[c]: $SiO_2$ (65), $Al_2O_3$ (20), BaO (10), CaO (5)
[d]: $SiO_2$ (42.2), $Al_2O_3$ (18.5), $La_2O_3$ (39.3)

The slags melt below the melting point of Silicon (1414° C.) thereby satisfying one of the conditions for floating solid Silicon over the candidate slags. The densities of these slags are about 2.6-3.0 $g/cm^3$ which is very close to molten Silicon (d=2.57 $g/cm^3$). Experiments were carried out at 1500° C.

Figure 12:
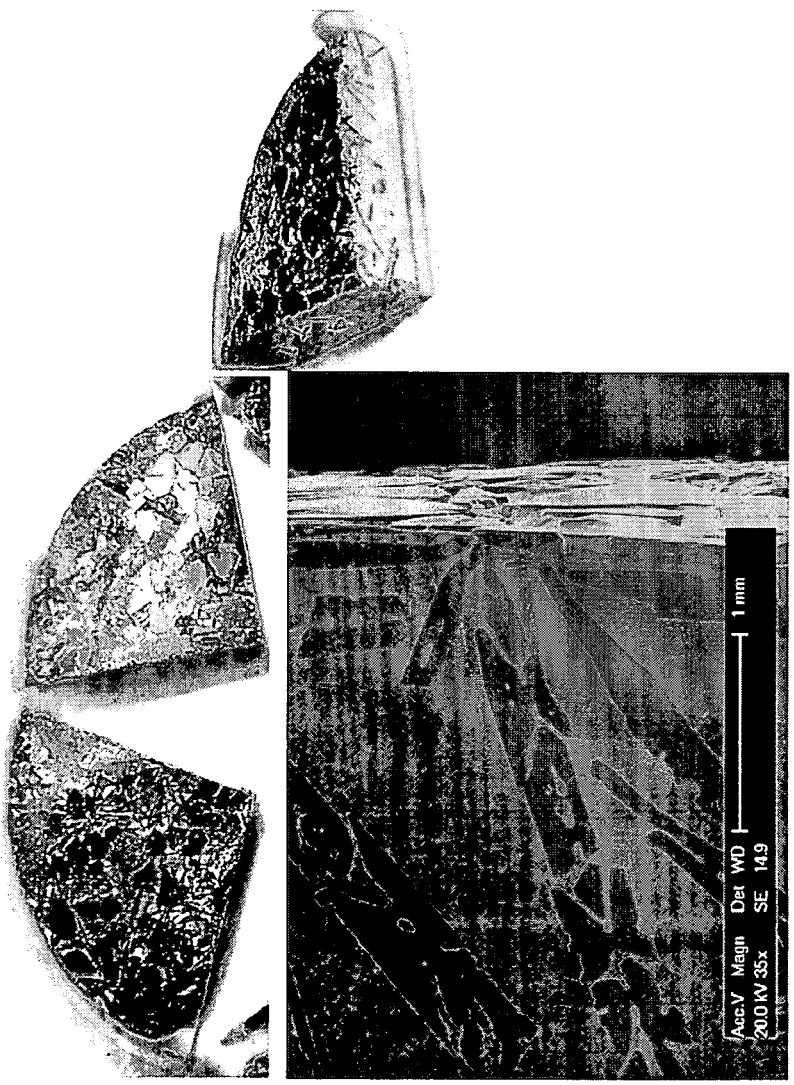
FIG. 12 illustrates as-produced Silicon (after solidification) sheet (Top), and cross-sectional SEM-micrograph showing ~300 μm thin sheet of Silicon produced on tin-lead substrate after solidification (Bottom).
Figure 13:
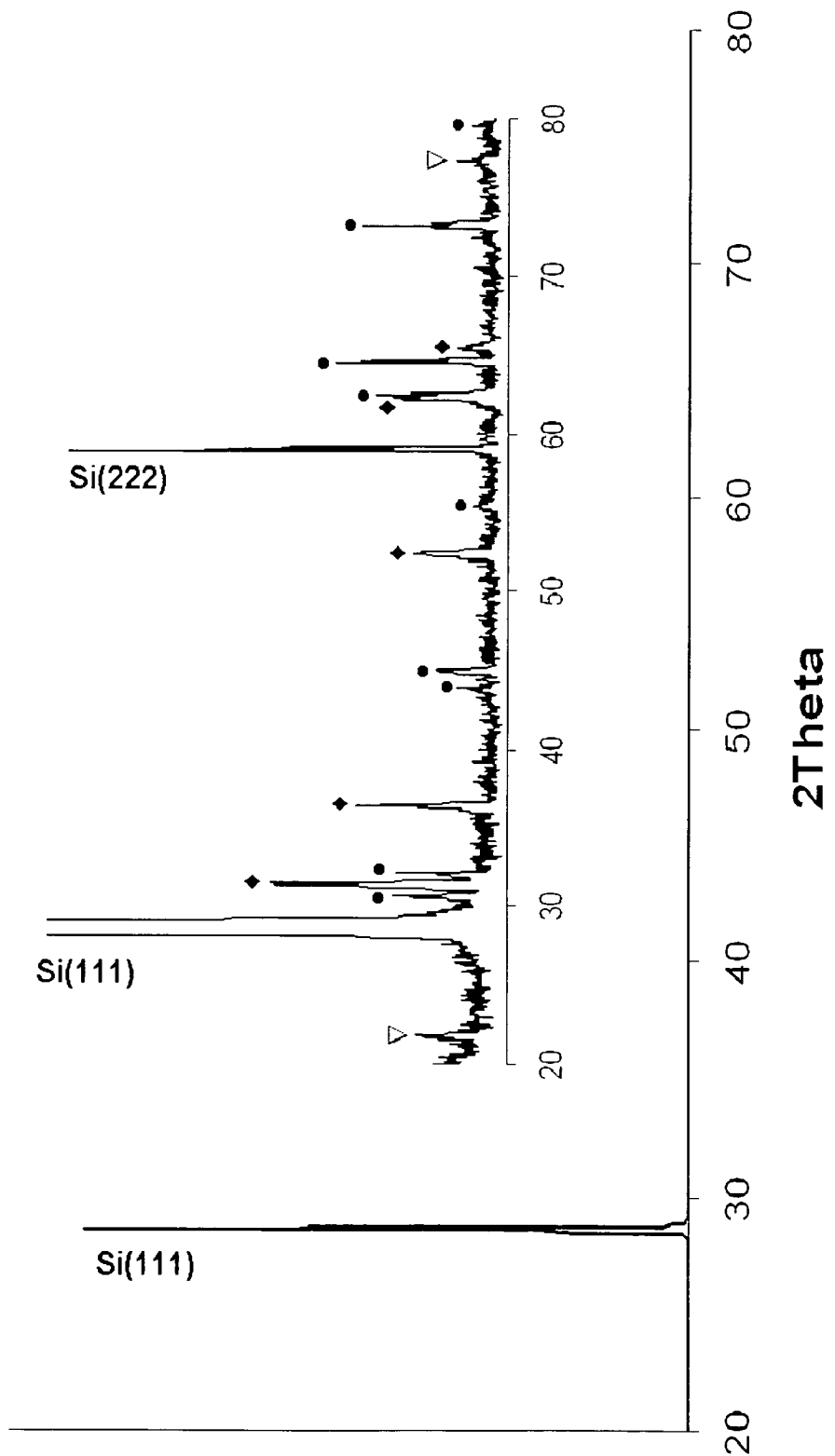
FIG. 13 illustrates XRD result of Si sheet. As-grown Silicon sheet shows the peaks of $SiO_2$ cristobalite (▽), Lead (♦) and Tin (●). The inset shows the enlargement without the complete Si<111> peak.
Figure 14:
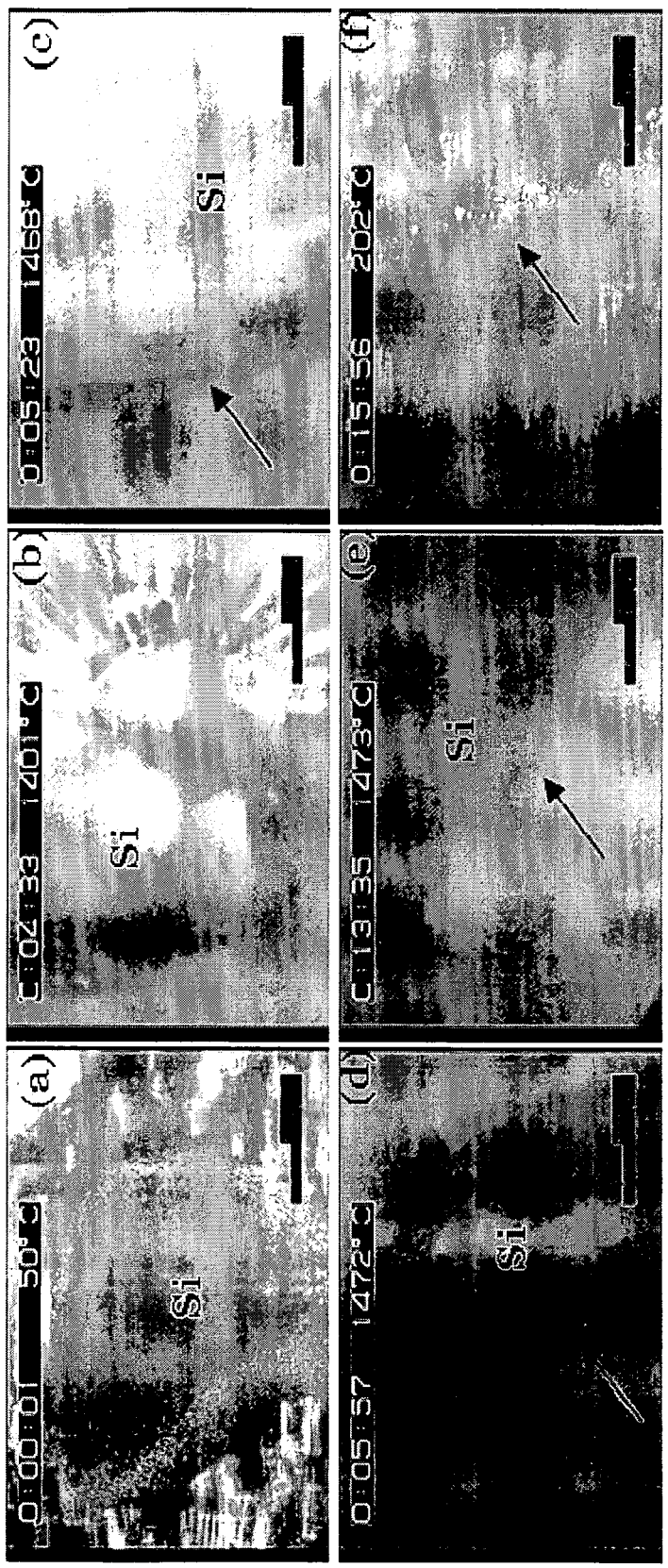
FIG. 14 illustrates in situ three-component-three-layer process, monitoring floating of Si over molten Sn and glass (a-f); arrow represents movement of liquid front (c), formation of microscopic droplets (d), stabilized interfacial state (e) and reappearance of droplets upon cooling.

The X-ray Diffraction (XRD) patterns and cross-sectional Scanning Electron Microscopy (SEM), as shown in FIGS. 12 and 13 respectively, exhibit that the sheet formed over molten alloys (Tin-Lead) is predominantly comprised of single-crystalline Si<111> having thickness of ~300 µm after solidification. Energy Dispersive Spectroscopic (EDS) analysis observed the entrainment of Silicon into molten substrate as well as the formation oxidized silicon product. In a two-layered molten substrate, high-density metals such as tin (Sn) surface serves as the platform in producing silicon layer by increasing the wettability factor. In a novel three-component-three-layer process, use of rare-earth aluminosilicate glass [d] can serve as a dielectric, lubricating layer, FIG. 14. The dielectric layer is believed to promote crystallization of floating molten Silicon into a single-crystalline thin sheet upon solidification and diminish the Si entrainment into the substrate.

Figure 15:
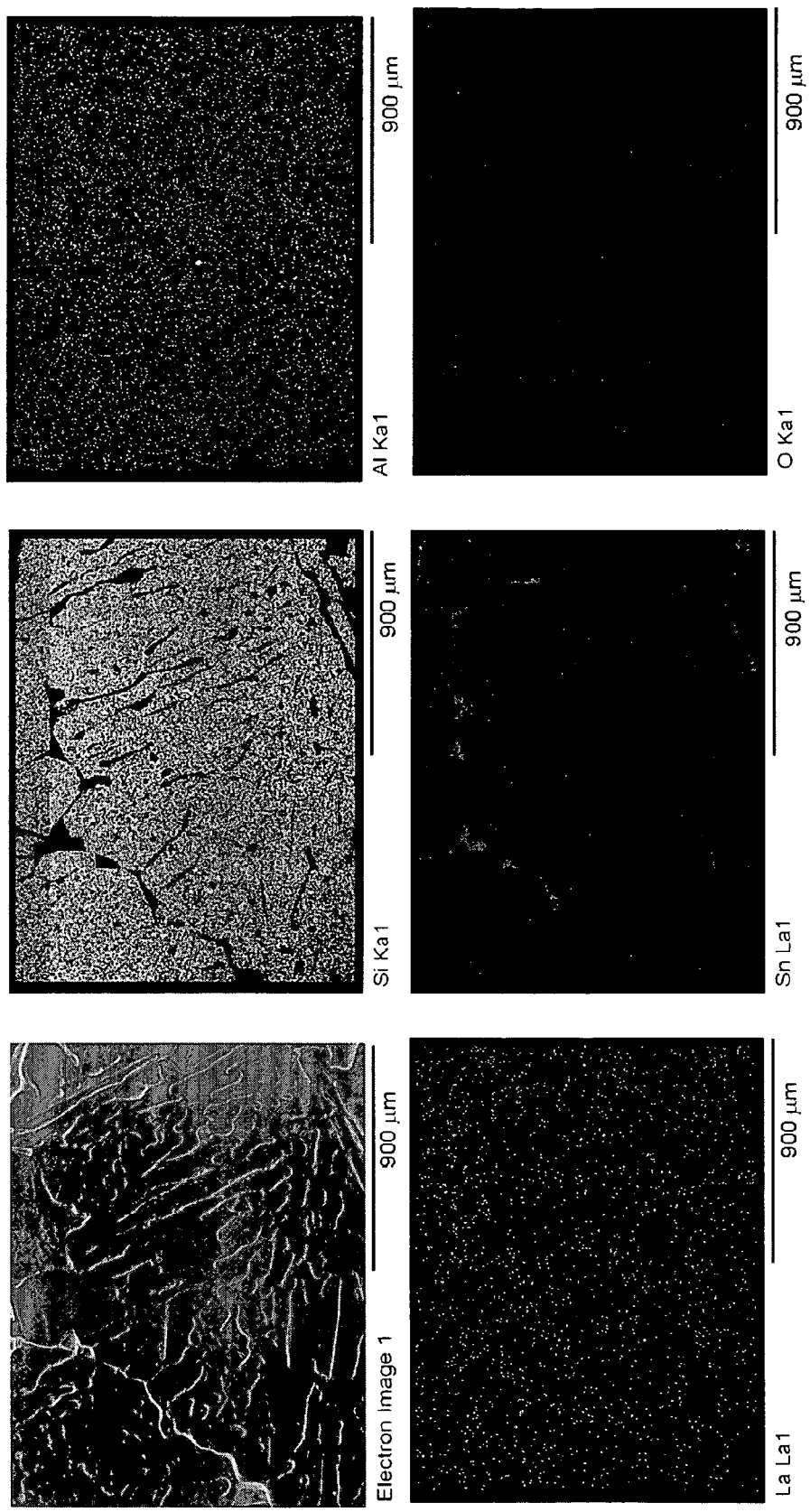
FIG. 15 illustrates an SEM micrograph of the top surface of the floated molten Si thin sheet over molten Sn-slag ($SiO_2$—$La_2O_3$—$Al_2O_3$) after solidification and the corresponding EDS element maps for Si, Al, La, and Sn.

EDS elemental mapping analysis were applied to determine the nature of the film surface and are presented for Si, O, Al, La and Sn in FIG. 15. The element maps clearly observe the dominance of Si atom on the surface and some entrained region with Sn along with traces of O atom. The negligible fractions of Al and La were also seen. These data reveal that making of silicon thin sheet on molten metal-slag, tin-glass [d], system can be realized. The possible cause of concern in the as-produced Silicon sheet on top of the molten substrate(s) is buoyancy driven Marangoni effect that affects the flatness of top (Silicon) surface by breaking the film as isolated islands upon solidification [Saiz E and Tomsia A P. Atomic dynamics and Marangoni films during liquid-metal spreading. Nature Materials, 3, 903-908 (2004).]. Coalescence and contamination of Si during crystallization and from the volatiles produced were not observed. Direct observation suggests that slag can provide a very thin insulating layer, possibly forming an unsteady liquid-liquid interface of silicon and slag. Without being bound by theory, it is possible that this observation can be related to Mullins-Sekerka instability at Si-melt interface[Fujiwara, K. Obinata, Y., Ujihara, T., Usami, N., Sazaki, G., Nakajima, K. In-Situ observations of melt growth behavior of polycrystalline silicon. Journal of Crystal Growth, 262, 124-129 (2004)].

We have developed a two-dimensional fluid flow model to study the solidification dynamics and the feasibility of wafer formation by controlling the temperature of the molten substrate along the float region. For this purpose, the phase change occurring in the system by the solidification of molten silicon on molten substrate has been modeled by employing an enthalpy formulation based fixed grid methodology [Voller, V. R. and Prakash, C. (1987) A fixed grid numerical modeling methodology for convection-diffusion mushy region phase-change problems, International Journal of Heat and Mass Transfer, 30(8), 1709-1719.] coupling the melt flow with the heat transfer and phase change. By and large, the phase transition for metals and metal alloys is spread out over a wide temperature range with complex solidification kinetics. This results in a mixture of solid and molten material often referred as mushy region. The effect due to mushy region is also incorporated in the model. The model equations are solved based on finite element method using the multiphysics modeling software COMSOL.

The flow of molten silicon on the molten substrate is represented by a non-isothermal fluid flow model [COMSOL Multiphysics 3.2, (2005) Processing and Manufacturing models: Continuous Casting, Reference Manual.]

$$\rho \frac{\partial \vec{u}}{\partial t} + \rho \vec{u} \cdot \nabla \vec{u} = \nabla \cdot \left[ -pI + \eta(\nabla \vec{u} + (\nabla \vec{u})^T) - \left(\frac{2\eta}{3} - \kappa\right)(\nabla \vec{u})I \right] + F \quad (1)$$

$$\frac{\partial \rho}{\partial t} + \nabla \cdot (\rho \vec{u}) = 0 \quad (2)$$

where $\rho$ represents density, $\eta$ is viscosity and $\kappa$ represents the dilatational viscosity.

The difference in velocity of the fluid before and after phase change is characterized by the term F in equation 1. The term F dampens the velocity of the fluid based on a factor B which signifies the solidification region. The solidification factor B is given by $$B = \begin{cases} 1 & | T > T_m + \Delta T \\ \frac{T - T_m + \Delta T}{2\Delta T} & | (T_m - \Delta T) \le T \le (T_m + \Delta T) \\ 0 & | T < T_m - \Delta T \end{cases} \quad (3)$$

The temperature of the system is represented by the energy balance equation as $$\rho c_p \frac{\partial T}{\partial t} - \nabla \cdot (k \nabla T) = Q - (\rho c_p \vec{u} \cdot \nabla T) + c(T_{amb}^4 - T^4) \quad (4)$$

Figure 16:
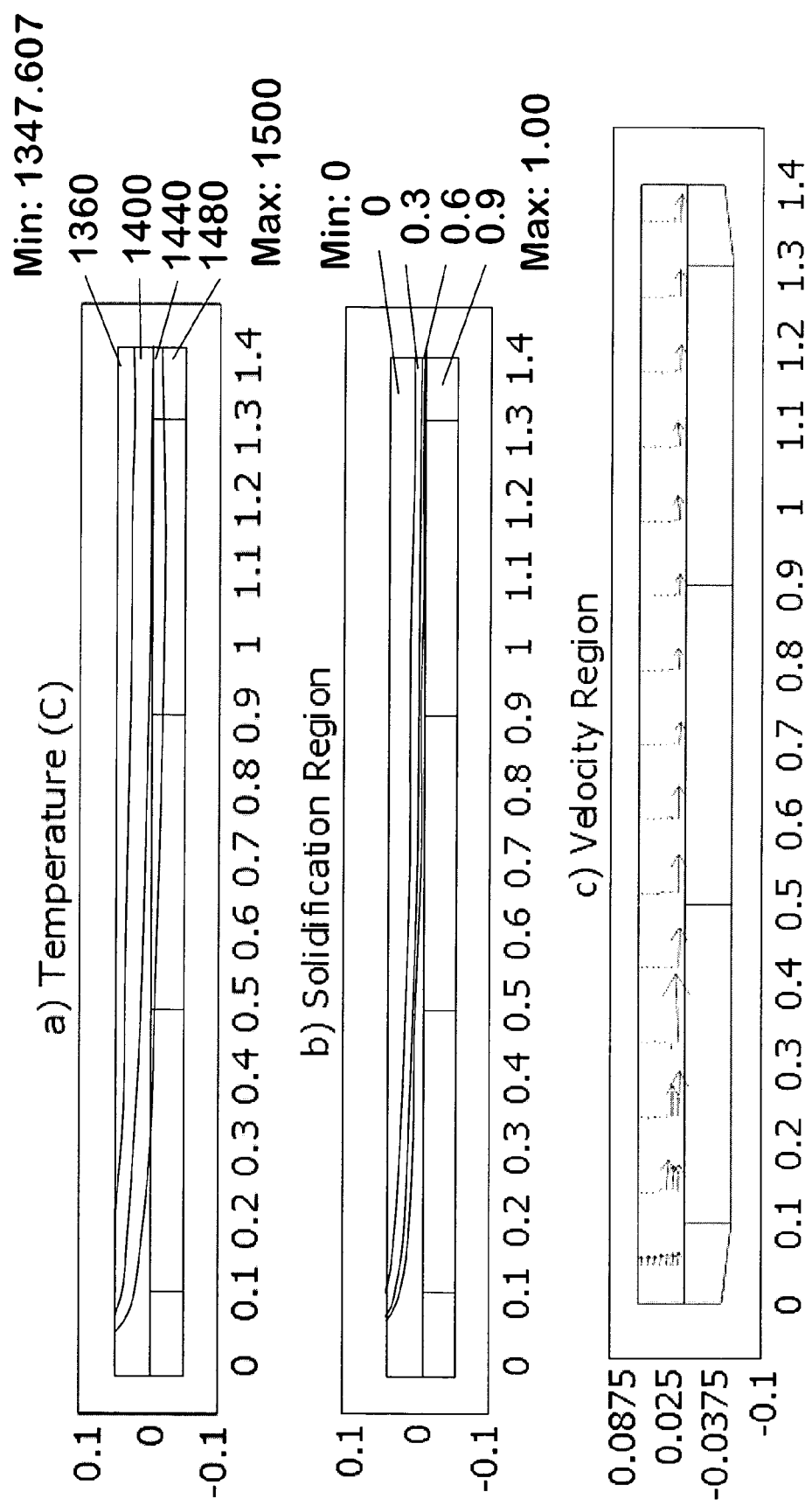
FIG. 16 illustrates fluid flow-non isothermal modeling of the silicon float process according to one embodiment of the present invention.

The heat capacity is accounted for both the specific heat capacity of the fluid and the latent heat of transition. $T_{amb}$ is the ambient temperature and $T_m$ is the melting point. The model equations are developed in order to illustrate the solidification of molten Silicon (melting point=1414° C.) on the liquid substrate. FIG. 16B shows the interface formed between the silicon and substrate in their molten form. Along with that, as the temperature is decreased (FIG. 16A) further, silicon solidifies on top of the molten substrate and starts floating on the surface. This phenomenon is confirmed by the velocity plot in FIG. 16C. An arrow plot is shown which shows that the velocity of fluid becomes zero as the solidification happens and this phenomenon is seen only on the surface of the molten bath. Thus, the simulations show that, by maintaining the substrate in its molten form at bottom, it is possible to initiate solidification process of Silicon from the top. However, a careful control of the temperature throughout the float process is essential. With a suitable process model and appropriate sensor locations, such a process can be controlled with a robust control algorithm.

Figure 17:
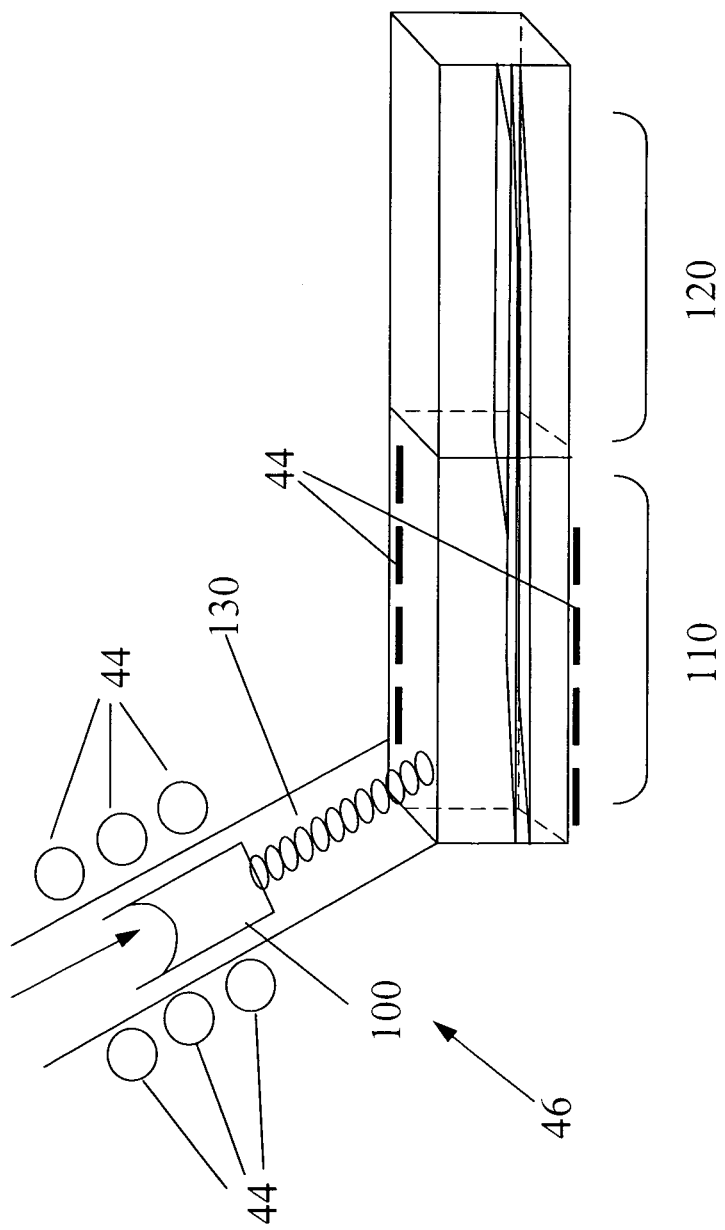
FIG. 17 illustrates one embodiment of an apparatus for a float process according to the present invention.

FIG. 17 illustrates another embodiment of an apparatus design for a float process according to the present invention. In that embodiment, solid silicon or other material is put into the first tank 100 under inert gas (e.g., Ar/H$_2$). The first tank 100 may be, for example, a crucible. The solid silicon is then heated by heaters 44 and, after it is in the liquid state, the liquid silicon passes through a passage 130 and into the float area 110. The liquid silicon is cooled and a solid layer is formed as described herein.

Figure 18:
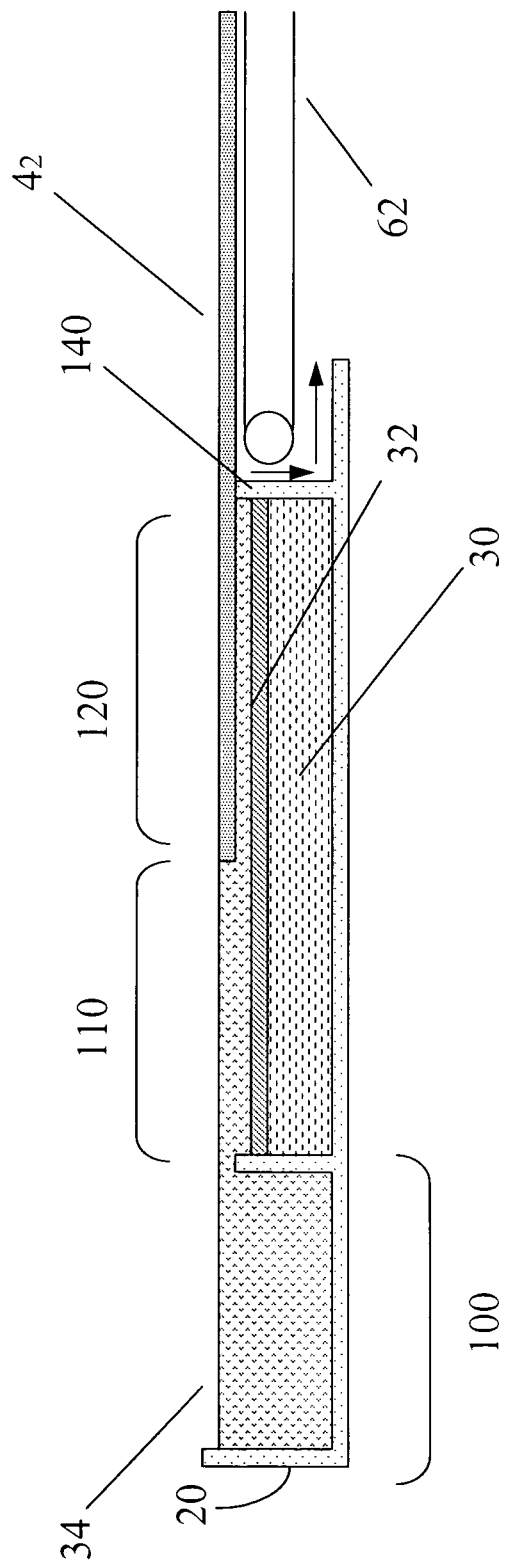
FIG. 18 illustrates another embodiment of the present invention.

FIG. 18 illustrates another embodiment of the present invention. In that embodiment the solid layer 42 is produced by a continuous process in which the solid layer 42 produced in the chamber 20 proceeds to a conveyor belt 62, such as a wire or rubber conveyor belt. In that embodiment, it is expected that some liquid silicon 32 will spill over the overflow wall 140 of the container 20.

Many variations are possible with the present invention. For example, this embodiment does not illustrate the use of coolers 40, heaters 44, and feeders 46, those and other devices may be included as described herein.

Figure 19:
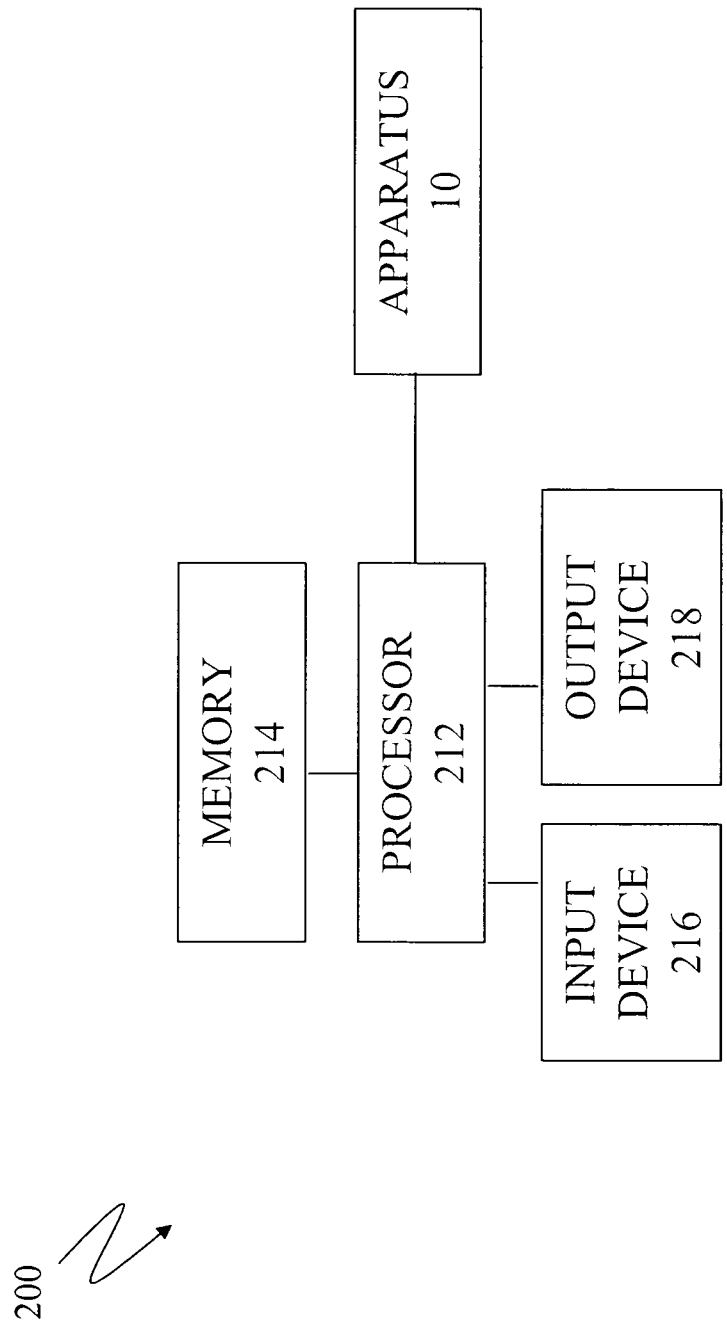
FIG. 19 illustrates one embodiment of a system according to the present invention.

FIG. 19 illustrates one embodiment of a system 200 according to the present invention in which the present invention is monitored and/or controlled by one or more computers. For example, the system 200 may monitor the temperature of various parts of the apparatus 10 and provide control signals to heaters 44 and coolers 40 in the apparatus 10 to maintain the temperature within a desired temperature range. The system 200 may also control the extractor 60, control the rate at which the solid layer 42 is removed from the container 20, control the input of material from the feeder 46, and monitor and control other aspects of the invention.

In the illustrated embodiment, the system 200 includes a processor 212, memory 214, an input device 216, and an output or display device 218, such as a monitor. The processor 212 is connected to the memory 214, the input device 216, and the output device 218. The memory 214 includes computer readable instructions, such as computer hardware, software, firmware, or other forms of computer-readable instructions which, when executed by the processor 212, cause the processor 12 to monitor and/or control the apparatus and process as described herein.

The processor 212 receives input from the input device 216, and provides signals to control the output device 218. The processor 212 also performs certain functions, as described herein.

The memory 214 can be any for of computer-readable memory, and may store information in magnetic form, optical form, or other forms. The memory includes computer readable instructions which, when executed by the processor 212, cause the processor 212 to perform certain functions, as described herein. The memory 214 may be separate from the processor 212, or the memory 214 may be integrated with the processor 212. The memory 214 may also include more than one memory device, which may be integrated with the processor 212, separate from the processor 212, or both.

The input device 216 may be a keyboard, a touchscreen, a computer mouse, or other forms of inputting information from a user. The input device 216 may also be used for inputting information from a source other than a human user, such as a data port.

The output device 218 may be a video display or other forms of outputting information to a user. The output device 218 may also be used for outputting information to something other than a human user, such as a data port.

Many variations are possible with the system 200 according to the present invention. For example, more than one processor 212, memory 214, input device 216, and output device 218 may be present in the system 200.

The present invention may be embodied in many forms. For example, the present invention may be an embedded system such as software on a chip. In another embodiment, the present invention may be embodied as one or more devices located in one or more parts of the invention illustrated in FIG. 19. For example, the present invention may be embodied as computer-readable instructions (e.g, software on a chip, software in a portable or integrated memory device, hard-wired instructions embodied in a hardware device, or other variations). In another embodiment, the present invention may be embodied as one or more discrete computers. The present invention may also be embodied as computer-readable instructions (e.g., computer software, firmware, or hardware). The computer-readable instructions may be stored in memory devices which may be integrated or embedded into another device, or which may be removable and portable. Other variations and embodiments are also possible.

Although the present invention has generally been described in terms of specific embodiments and implementations, the present invention is applicable to other apparatuses and methods. Those and other variations and modifications of the present invention are possible and contemplated, and it is intended that the foregoing specification and the following claims cover such modifications and variations.

The invention claimed is:

1. A method for producing a solid layer material, comprising:
   providing a first layer;
   providing a second liquid layer on the first layer;
   providing a third liquid layer on the second liquid layer, wherein the third liquid layer has a melting point that is higher than a melting point of the second liquid layer, and wherein the second liquid layer is between the first and third layers;
   cooling a surface of the third liquid layer to a temperature less than the melting point of the third liquid layer;
   forming the solid layer from the third liquid layer while cooling the third layer liquid; and
   removing the solid layer, wherein:
      the first layer is in liquid form, has a melting point, and has a first density;
      the second liquid layer has a melting point and a second density, and the second density is less than the first density;
      the second liquid layer is located between the first and third layers;
      the third liquid layer has a melting point that is higher than both the melting point of the first liquid layer and the melting point of the second liquid layer.

2. The method of claim 1, wherein the third liquid layer has a third density that is less than the second density.

3. A method for producing a solid layer material, comprising:
   providing a first layer;
   providing a second liquid layer on the first layer;
   providing a third liquid layer on the second liquid layer, wherein the third liquid layer has a melting point that is higher than a melting point of the second liquid layer, and wherein the second liquid layer is between the first and third layers;
   cooling a surface of the third liquid layer to a temperature less than the melting point of the third liquid layer;
   forming the solid layer from the third liquid layer while cooling the third layer liquid; and
   removing the solid layer;
   wherein the second liquid layer is a dielectric material.

4. A method for producing a solid layer material, comprising:
   providing a first layer;
   providing a second liquid layer on the first layer;
   providing a third liquid layer on the second liquid layer, wherein the third liquid layer has a melting point that is higher than a melting point of the second liquid layer, and wherein the second liquid layer is between the first and third layers;
   cooling a surface of the third liquid layer to a temperature less than the melting point of the third liquid layer;
   forming the solid layer from the third liquid layer while cooling the third layer liquid; and
   removing the solid layer;
   wherein the second liquid layer is selected from a group comprising aluminosilicate glass and rare-earth aluminosilicate glass and having a composition calculated in weight percent on an oxide basis selected from a group comprising 40-70 wt %/$SiO_2$, 5-20 wt %/$Al_2O_3$, and 10-40 wt %/rare-earth metal oxide ($RE_xO_y$).

5. The method of claim 4, wherein the rare-earth metal oxide ($RE_xO_y$) is selected from a group comprising of $La_2O_3$, $CeO_2$ and $Gd_2O_3$.

6. The method of claim 4, wherein the rare-earth aluminosilicate glass has a composition when calculated in weight percent on an oxide basis, selected from a group comprising: 40-70 wt % $SiO_2$, 5-20 wt % $Al_2O_3$, and 10-40 wt % $RE_xO_y$.

7. The method of claim 4, wherein the second liquid layer includes at least one modifying oxide selected from the group comprising of heavy metal oxides, transition metal oxides and alkaline earth metal oxides.

8. The method of claim 7, wherein the modifying oxide comprises, as calculated in weight percent on an oxide basis, 2-15%.

9. A method for producing a solid layer material, comprising:
   providing a first layer;
   providing a second liquid layer on the first layer;
   providing a third liquid layer on the second liquid layer, wherein the third liquid layer has a melting point that is higher than a melting point of the second liquid layer, and wherein the second liquid layer is between the first and third layers;
   cooling a surface of the third liquid layer to a temperature less than the melting point of the third liquid layer;
   forming the solid layer from the third liquid layer while cooling the third layer liquid; and
   removing the solid layer;
   wherein the second liquid layer has a concave-meniscus shape at an interface between the second liquid layer and the third liquid layer.

10. A method for producing a solid layer material, comprising:
- providing a first layer;
- providing a second liquid layer on the first layer;
- providing a third liquid layer on the second liquid layer, wherein the third liquid layer has a melting point that is higher than a melting point of the second liquid layer, and wherein the second liquid layer is between the first and third layers;
- cooling a surface of the third liquid layer to a temperature less than the melting point of the third liquid layer;
- forming the solid layer from the third liquid layer while cooling the third layer liquid; and
- removing the solid layer;
- wherein the second liquid layer includes a material selected from a group comprising ternary oxides and quaternary oxyfluorides.

11. The method of claim 10, wherein the second liquid layer includes a modifying fluoride.

12. The method of claim 11, wherein the modifying fluoride is selected from a group comprising LiF, NaF, $CaF_2$, $BaF_2$, $AlF_3$, $ZrF_2$, $LaF_3$, CeF3, $GdF_3$.

13. The method of claim 12, wherein the modifying fluorides comprises, as calculated in total weight percent, 2-15%.

14. A method for producing a solid layer material, comprising:
- providing a first layer;
- providing a second liquid layer on the first layer;
- providing a third liquid layer on the second liquid layer, wherein the third liquid layer has a melting point that is higher than a melting point of the second liquid layer, and wherein the second liquid layer is between the first and third layers;
- cooling a surface of the third liquid layer to a temperature less than the melting point of the third liquid layer;
- forming the solid layer from the third liquid layer while cooling the third layer liquid; and
- removing the solid layer;
- wherein the second liquid layer includes a modifying oxide.

15. The method of claim 14, wherein the modifying oxide is selected from a group comprising $TiO_2$, $Sc_2O_3$, $Y_2O_3$, $ZrO_2$, $Nb_2O_5$, SrO, BaO, $Bi_2O_3$.

16. A method for producing a solid layer material, comprising:
- providing a first layer;
- providing a second liquid layer on the first layer;
- providing a third liquid layer on the second liquid layer, wherein the third liquid layer has a melting point that is higher than a melting point of the second liquid layer, and wherein the second liquid layer is between the first and third layers;
- cooling a surface of the third liquid layer to a temperature less than the melting point of the third liquid layer;
- forming the solid layer from the third liquid layer while cooling the third layer liquid; and
- removing the solid layer;
- wherein the second liquid layer includes a basic oxide.

17. The method of claim 16, wherein the basic oxide is selected from a group comprising CaO, MgO, SrO and BaO.

18. A method for producing a solid layer material, comprising:
- providing a first layer;
- providing a second liquid layer on the first layer;
- providing a third liquid layer on the second liquid layer, wherein the third liquid layer has a melting point that is higher than a melting point of the second liquid layer, and wherein the second liquid layer is between the first and third layers;
- cooling a surface of the third liquid layer to a temperature less than the melting point of the third liquid layer;
- forming the solid layer from the third liquid layer while cooling the third layer liquid; and
- removing the solid layer;
- further comprising removing impurities from the third liquid layer to the second liquid layer.

19. The method of claim 18, wherein removing impurities from the third liquid layer includes reducing Boron in the third liquid layer to less than 0.3 parts per million.

* * * * *